US011355627B2

(12) United States Patent
Nagahisa et al.

(10) Patent No.: US 11,355,627 B2
(45) Date of Patent: Jun. 7, 2022

(54) SILICON CARBIDE SEMICONDUCTOR DEVICE AND POWER CONVERTER

(71) Applicant: Mitsubishi Electric Corporation, Tokyo (JP)

(72) Inventors: Yuichi Nagahisa, Tokyo (JP); Shiro Hino, Tokyo (JP); Hideyuki Hatta, Tokyo (JP); Koji Sadamatsu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 268 days.

(21) Appl. No.: 16/759,731

(22) PCT Filed: Aug. 23, 2018

(86) PCT No.: PCT/JP2018/031165
§ 371 (c)(1),
(2) Date: Apr. 28, 2020

(87) PCT Pub. No.: WO2019/123717
PCT Pub. Date: Jun. 27, 2019

(65) Prior Publication Data
US 2020/0312995 A1 Oct. 1, 2020

(30) Foreign Application Priority Data
Dec. 19, 2017 (JP) .............................. JP2017-242641

(51) Int. Cl.
H01L 29/78 (2006.01)
H01L 29/16 (2006.01)
(Continued)

(52) U.S. Cl.
CPC ...... H01L 29/7806 (2013.01); H01L 29/1608 (2013.01); H01L 29/41741 (2013.01);
(Continued)

(58) Field of Classification Search
CPC . H02M 1/08; H02M 7/53871; H01L 29/0615; H01L 29/0619; H01L 29/0696;
(Continued)

(56) References Cited

U.S. PATENT DOCUMENTS 8,772,788 B2 * 7/2014 Ikegami .............. H01L 29/7827
257/77
9,240,451 B2 * 1/2016 Imai ........................ H01L 29/47
(Continued)

FOREIGN PATENT DOCUMENTS

JP 2003-017701 A 1/2003
JP 2011-254012 A 12/2011
(Continued)

OTHER PUBLICATIONS

Office Action dated Mar. 2, 2021 in Japanese Patent Application No. 2020-077214, 11 pages.
(Continued)

Primary Examiner — Matthew V Nguyen
(74) Attorney, Agent, or Firm — Xsensus LLP

(57) ABSTRACT

In SiC-MOSFETs including Schottky diodes, passage of a bipolar current to a well region in a terminal region cannot be sufficiently reduced, which may reduce the reliability of elements. A SiC-MOSFET including Schottky diodes includes a gate electrode formed, through a second insulating film thicker than a gate insulating film in an active region, on a separation region between a first well region in the active region that is the closest to the terminal region and a second well region in the terminal region, wherein the second well region has a non-ohmic connection to a source electrode. Thus, a decrease in the reliability of elements is prevented.

32 Claims, 26 Drawing Sheets

(51) Int. Cl.
   *H01L 29/417* (2006.01)
   *H01L 29/66* (2006.01)
   *H02M 1/08* (2006.01)
   *H02M 7/5387* (2007.01)
(52) U.S. Cl.
   CPC ........ *H01L 29/66712* (2013.01); *H02M 1/08* (2013.01); *H02M 7/53871* (2013.01)
(58) Field of Classification Search
   CPC ........... H01L 29/1608; H01L 29/41741; H01L 29/66068; H01L 29/66712; H01L 29/7806; H01L 29/7811; H01L 29/872
   See application file for complete search history.

(56) References Cited

U.S. PATENT DOCUMENTS

| | | |
|---|---|---|
| 2011/0278599 A1 | 11/2011 | Nakao et al. |
| 2013/0026494 A1 | 1/2013 | Oritsuki et al. |
| 2013/0033300 A1 | 2/2013 | Okada et al. |
| 2013/0107600 A1 | 5/2013 | Hayashi et al. |
| 2014/0252378 A1 | 9/2014 | Ota et al. |
| 2015/0236012 A1 | 8/2015 | Hino et al. |
| 2016/0079411 A1 | 3/2016 | Hino et al. |
| 2017/0229573 A1* | 8/2017 | Kinoshita ........... H01L 29/0661 |
| 2019/0057873 A1 | 2/2019 | Sugahara et al. |
| 2019/0096999 A1* | 3/2019 | Kojima ............... H01L 29/0865 |
| 2019/0181259 A1 | 6/2019 | Hino et al. |
| 2019/0245052 A1* | 8/2019 | Ohoka .............. H01L 29/41741 |
| 2019/0371935 A1 | 12/2019 | Hatta et al. |
| 2019/0371936 A1 | 12/2019 | Nagahisa et al. |

FOREIGN PATENT DOCUMENTS

| | | | |
|---|---|---|---|
| JP | 2012-216705 A | 11/2012 | |
| JP | 2013-026563 A | 2/2013 | |
| JP | 2014-045211 A | 3/2014 | |
| JP | 2014-175412 A | 9/2014 | |
| WO | 2010/098294 A1 | 9/2010 | |
| WO | 2012/056704 A1 | 5/2012 | |
| WO | 2013/051170 A1 | 4/2013 | |
| WO | WO-2013146326 A1 * | 10/2013 | ......... H01L 21/0495 |
| WO | 2014/038110 A1 | 3/2014 | |
| WO | 2014/162969 A1 | 10/2014 | |
| WO | 2017/169086 A1 | 10/2017 | |
| WO | 2017/179102 A1 | 10/2017 | |
| WO | 2018/155553 A1 | 8/2018 | |
| WO | 2018/155566 A1 | 8/2018 | |

OTHER PUBLICATIONS

International Search Report and Written Opinion dated Nov. 20, 2018 for PCT/JP2018/031165 filed on Aug. 23, 2018, 10 pages including English Translation of the International Search Report.

International Search Report and Written Opinion dated Mar. 26, 2019 for PCT/JP2018/046575 filed on Dec. 18, 2018, 11 pages including English Translation of the International Search Report.

International Search Report and Written Opinion dated Apr. 2, 2019 for PCT/JP2018/046591 filed on Dec. 18, 2018, 09 pages including English Translation of the International Search Report.

Notification of Reasons for Refusal received for Japanese Patent Application No. 2019-514325, dated Jul. 2, 2019, 13 pages including English Translation.

Notification of Decision of Refusal received for Japanese Patent Application No. 2019-514325, dated Jan. 28, 2020, 10 pages including English Translation.

U.S. Appl. No. 16/757,767, filed Apr. 21, 2020, is a co-pending related application to the present application.

U.S. Appl. No. 16/885,319, filed May 28, 2020, is a co-pending related application to the present application.

* cited by examiner

F I G. 2 6
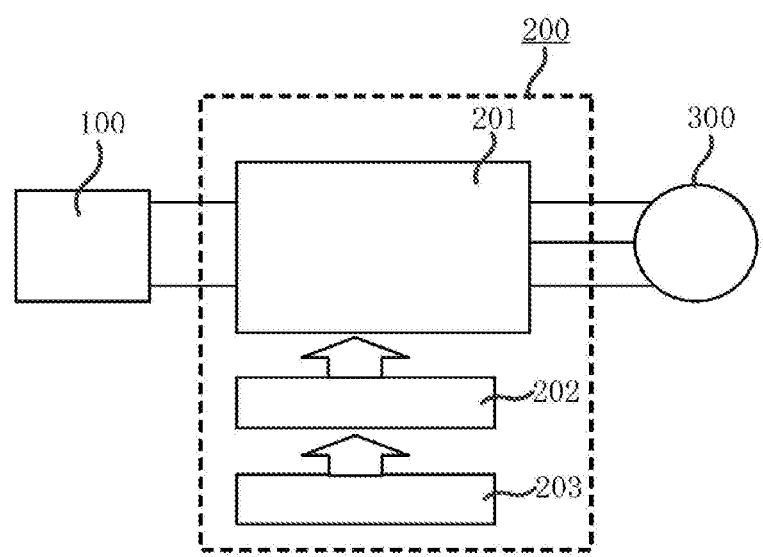

SILICON CARBIDE SEMICONDUCTOR DEVICE AND POWER CONVERTER

CROSS-REFERENCE TO RELATED APPLICATIONS

The present application is based on PCT filing PCT/JP2018/031165, filed Aug. 23, 2018, which claims priority to JP2017-242641, filed Dec. 19, 2017, the entire contents of each are incorporated herein by reference.

TECHNICAL FIELD

The present invention relates to a silicon carbide semiconductor device made of silicon carbide and to a power converter.

BACKGROUND ART

It is known that continuously passing a forward current, specifically, a bipolar current through a p-n diode made of silicon carbide (SiC) creates a problem in the reliability, that is, stacking faults in crystals which cause a forward voltage to shift. This probably occurs due to expansion of the stacking faults, specifically, plane defects with recombination energy obtained when minority carriers implanted through the p-n diode are recombined with majority carriers. The expansion originates from, for example, a basal plane dislocation in a silicon carbide substrate. The stacking faults obstruct the current flow. Hence, the expansion of the stacking faults reduces the current and increases the forward voltage, thus causing reduction in the reliability of a semiconductor device.

Such increase in the forward voltage also occurs in vertical metal oxide semiconductor field effect transistors (MOSFETs) made of silicon carbide. The vertical MOSFETs include a parasitic p-n diode (body diode) between a source and a drain. When the forward current flows through this body diode, the vertical MOSFETs also suffer from the reduction in the reliability, similarly to the p-n diode. When a body diode of a SiC-MOSFET is used as a free-wheeling diode of a MOSFET, the characteristics of this MOSFET may be degraded.

One method for solving the problem in the reliability due to the passage of the forward current through the parasitic p-n diode is to apply stress for passing a forward current through the parasitic p-n diode for a long time, measure changes between a forward voltage before the stress application and a forward voltage after the stress application, and eliminate (screen out) an element with large change in the forward voltage from products as described in Patent Document 1. However, this method has disadvantages of prolonging the duration of current passage and producing many defective items by using wafers with many defects.

Another method is to incorporate and use, in a semiconductor device as a unipolar transistor such as a MOSFET, unipolar diodes as free-wheeling diodes. For example, Patent Documents 2 and 3 each describe a method for incorporating Schottky barrier diodes (SBD) as unipolar diodes into a unit cell of a MOSFET.

When such a unipolar transistor including, in an active region, unipolar diodes, specifically, diodes in which a current is passed through only majority carriers is applied as a silicon carbide semiconductor device, no bipolar current flows through the body diodes during a free-wheeling operation by designing a diffusion potential of the unipolar diodes, specifically, a voltage for starting current passage to be lower than a diffusion potential at a p-n junction. This can suppress degradation in characteristics of the unipolar transistor in the active region.

As described in Patent Document 4, for example, a MOSFET including an n-type channel epitaxial layer on p-type well regions for forming an active region is expected to produce advantages similar to a MOSFET including SBDs. This MOSFET has been designed so that the channel epitaxial layer functions as unipolar diodes with a gate voltage lower than or equal to a threshold voltage and a turn-on voltage of the unipolar diodes is lower than an operating voltage of a p-n diode formed by the p-type well regions and an n-type drift layer. Such a MOSFET may also be referred to as a unipolar transistor including the unipolar diodes in the active region.

Even in the unipolar transistor including the unipolar diodes in the active region, a terminal region, namely, a region other than the active region, however, may have a portion with a parasitic p-n diode where the unipolar diodes are hardly disposed due to its structure.

For example, a region near a gate pad or near a terminal portion of a semiconductor device has a terminal well region protruding toward the periphery more than a source electrode. A parasitic p-n diode is formed between this terminal well region and a drift layer. In this portion, neither a Schottky electrode nor a unipolar diode is formed. Since there is no Schottky electrode in the terminal well region, a voltage between the source electrode and a drain electrode is applied to the p-n diode formed by the terminal well region and the drift layer. As a result, a bipolar current flows through the p-n diode.

When this portion includes, for example, the origin of the basal plane dislocation, the stacking faults may be expanded, which may reduce the breakdown voltage of a transistor. Specifically, a leakage current may occur when the transistor is in an OFF state, and the heat generated from the leakage current may break an element or a circuit.

This problem should be avoided by preventing a bipolar current from flowing through the p-n diode formed by the terminal well region and the drift layer, for example, by limiting, to a certain value or less, a voltage to be applied between the source and the drain during operations of the semiconductor device. Therefore, the chip size should be increased to reduce a differential resistance of incorporated SBDs per chip, so that a voltage between the source and the drain which is generated when a free-wheeling current flows will be reduced. However, this brings disadvantages of increase in the chip size and the cost.

Methods for suppressing a forward operation of the p-n diode formed by the terminal well region and the drift layer without increasing the chip size include a method for increasing the resistance of a current path formed between each portion of the terminal well region and a source electrode. Examples of the method for increasing the resistance of the current path include a method for increasing the contact resistance between the terminal well region and the source electrode (e.g. Patent Document 5). When a bipolar current flows through the p-n diode formed by the terminal well region and the drift layer in such a structure, the resistance component of the contact resistance causes a voltage drop. Thus, a difference between a potential of the terminal well region and a source potential is created, and the forward voltage to be applied to the p-n diode is reduced by the difference. Thus, the passage of the bipolar current can be suppressed.

Further, a known prominent phenomenon particularly in wide-bandgap semiconductor devices represented by silicon carbide is that a displacement current flowing through well regions may destroy an element in switching. Upon switching of a silicon carbide semiconductor device with a MOS structure, the displacement current flows through p-type well regions with a relatively large area in a plane direction of elements. This displacement current and a sheet resistance in the well regions generate a high voltage in the well regions. Then, occurrence of dielectric breakdown in an insulating film with an electrode formed on the well regions through the insulating film causes a breakdown in an element. For example, when the potential of the well regions fluctuates at 50 V or more and a gate electrode with a potential of approximately 0 V is formed on the well regions through a silicon oxide film 50 nm thick, the silicon oxide film may be subjected to dielectric breakdown with application of an electric field as high as 10 MV/cm to the silicon oxide film.

The following describes two reasons why this phenomenon prominently occurs in the wide-bandgap semiconductor devices represented by silicon carbide.

One reason is that since the impurity level of the p-type well regions formed in a wide-bandgap semiconductor made of, for example, silicon carbide is deeper than that of p-type well regions made of silicon, a sheet resistance of the p-type well regions of the wide-bandgap semiconductor is extremely higher than that of the p-type well regions made of silicon.

The other reason is that the use of an n-type drift layer of low resistance and high impurity concentration as a wide-bandgap semiconductor based on the fact that the wide-bandgap semiconductor is higher in dielectric breakdown field than a silicon semiconductor significantly increases the capacitance of a depletion layer formed in a p-n junction formed between the n-type drift layer and the p-type well regions in the wide-bandgap semiconductor more than that in the silicon, which consequently causes a large displacement current to flow in switching.

As the switching speed increases, the displacement current and the voltage generated in a well region also increase. For example, a proposal is made on a method for forming a p-type layer of low resistance in a part of the p-type well region as a method for reducing the voltage generated by this displacement current (e.g. Patent Document 6).

PRIOR ART DOCUMENT

Patent Document

[Patent Document 1] Japanese Patent Application Laid-Open No. 2014-175412
[Patent Document 2] Japanese Patent Application Laid-Open No. 2003-017701
[Patent Document 3] WO2014-038110
[Patent Document 4] WO2013/051170
[Patent Document 5] WO2014/162969
[Patent Document 6] WO2010/098294

SUMMARY

Problem to be Solved by the Invention

When an electrode having an ohmic connection to a source electrode is formed in a terminal well region, even if the contact resistance between the terminal well region and the source electrode is increased, sometimes, the resistance of the current path formed between the terminal well region and the source electrode cannot be sufficiently increased and the passage of the bipolar current to the terminal well region cannot be sufficiently reduced.

In an attempt to make the terminal well region and the p-type well regions in the active region different in potential by increasing the contact resistance between the terminal well region and the source electrode, forming, through a gate insulating film, a gate electrode on a region across the well regions (active well regions) in the active region and the terminal well region creates a parasitic p-MOSFET from an n-type separation region between the active well regions and the terminal well region, and the active well regions and the terminal well region which sandwich the n-type separation region. When this parasitic p-MOSFET is turned ON, the active well regions and the terminal well region may have the same potential. Particularly, when the potential for turning OFF a MOSFET, for example, a negative potential such as −5 V is set to a source potential, the parasitic p-MOSFET is turned ON. Consequently, the active well regions and the terminal well region are connected with low resistance, and the bipolar current easily flows through the terminal well region.

Although, for example, an insulating film corresponding to the gate insulating film of the parasitic p-MOSFET may be thickened to suppress operations of the parasitic p-MOSFET, thickening the insulating film on the terminal well region electrically isolates the terminal well region. Then, application of a high electric field between the terminal well region and a gate electrode formed on the terminal well region through the insulating film may cause dielectric breakdown in the insulating film and break an element. This high electric field is created by a high voltage generated in the terminal well region with the displacement current occurring in the switching operation.

As such, a method for avoiding element breakdown caused by the displacement current in switching without turning ON the parasitic p-MOSFET is not conventionally known.

The present invention has been conceived to solve the problems, and has an object of providing a more reliable silicon carbide semiconductor device in which the element breakdown caused by the passage of the displacement current as well as operations of the parasitic n-type channel MOSFET are suppressed.

Means to Solve the Problem

A silicon carbide semiconductor device according to the present invention includes: a semiconductor substrate made of silicon carbide of a first conductivity type; a drift layer of the first conductivity type, the drift layer being formed on the semiconductor substrate; a plurality of first well regions of a second conductivity type, the first well regions being formed in a surface layer of the drift layer; a plurality of first separation regions of the first conductivity type, the first separation regions being formed through the first well regions from a surface of the drift layer; a plurality of first Schottky electrodes formed on the respective first separation regions, the first Schottky electrodes forming Schottky junctions with the first separation regions; an ohmic electrode formed on each of the first well regions; a second well region of the second conductivity type, the second well region being formed in the surface layer of the drift layer separately from the first well regions; a source region of the first conductivity type, the source region being formed in a surface layer area of each of the first well regions; a gate insulating film formed on the first well regions; a second insulating film formed on an edge portion of the second well region that is closer to the first well regions, the second insulating film being thicker than the gate insulating film, the second well region being closest to the first well regions; a gate electrode formed on the second insulating film and the gate insulating film on the first well regions; a gate pad connected to the gate electrode and formed above the second well region; and a source electrode electrically connected to the first Schottky electrodes and the ohmic electrodes, the source electrode having a non-ohmic connection to the second well region through a second contact hole formed on the second well region.

Effects of the Invention

In the silicon carbide semiconductor device according to the present invention, the element breakdown caused by the passage of the displacement current as well as operations of the parasitic n-type channel MOSFET can be suppressed, and the reliability can be enhanced.

BRIEF DESCRIPTION OF DRAWINGS

FIG. 26 is a schematic view illustrating a configuration of a power converter according to Embodiment 8 of this invention.

DESCRIPTION OF EMBODIMENTS

Figure 1:
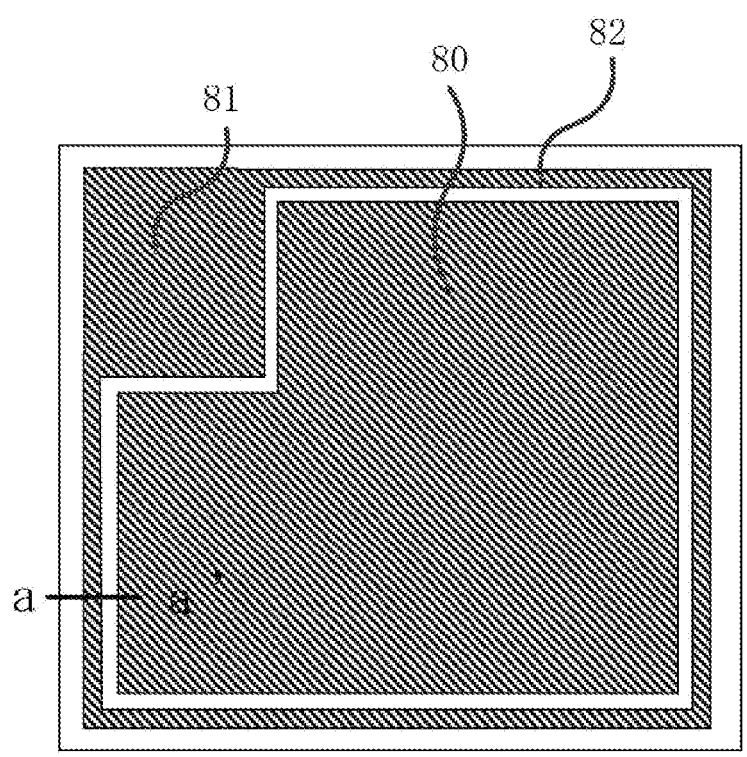
FIG. 1 is a schematic plan view of a silicon carbide semiconductor device according to Embodiment 1 of this invention when viewed from the top surface.

Embodiments will be described below with reference to the accompanying drawings. Since the drawings are schematically illustrated, the mutual relationships in size and position between images in the different drawings are not necessarily accurate but may be changed when needed. In the following description, the same reference numerals are assigned to the same constituent elements, and their names and functions are the same. Thus, the detailed description thereof may be omitted.

Embodiments in the DESCRIPTION will describe n-channel silicon carbide MOSFETs whose first conductivity type is n-type and whose second conductivity type is p-type, as example silicon carbide (SiC) semiconductor devices. A potential level will be described assuming the first conductivity type as n-type and the second conductivity type as p-type. Conversely, if the first conductivity type is p-type and the second conductivity type is n-type, the potential level will be described the other way around.

Furthermore, this application will describe a region of a silicon carbide semiconductor device where unit cells are periodically arranged as an active region, and a region other than the active region as a terminal region.

Embodiment 1

First, a structure of a silicon carbide semiconductor device according to Embodiment 1 of the present invention will be described.

FIG. 1 is a schematic plan view of a silicon carbide MOSFET with built-in Schottky diodes (SBDs) (SiC-MOSFET with built-in SBDs) as the silicon carbide semiconductor device according to Embodiment 1 when viewed from the top surface. In FIG. 1, a gate pad 81 is formed partly in an upper surface of the SiC-MOSFET, and a source electrode 80 is formed adjacent to the gate pad 81. A gate line 82 is formed to extend from the gate pad 81.

Figure 2:
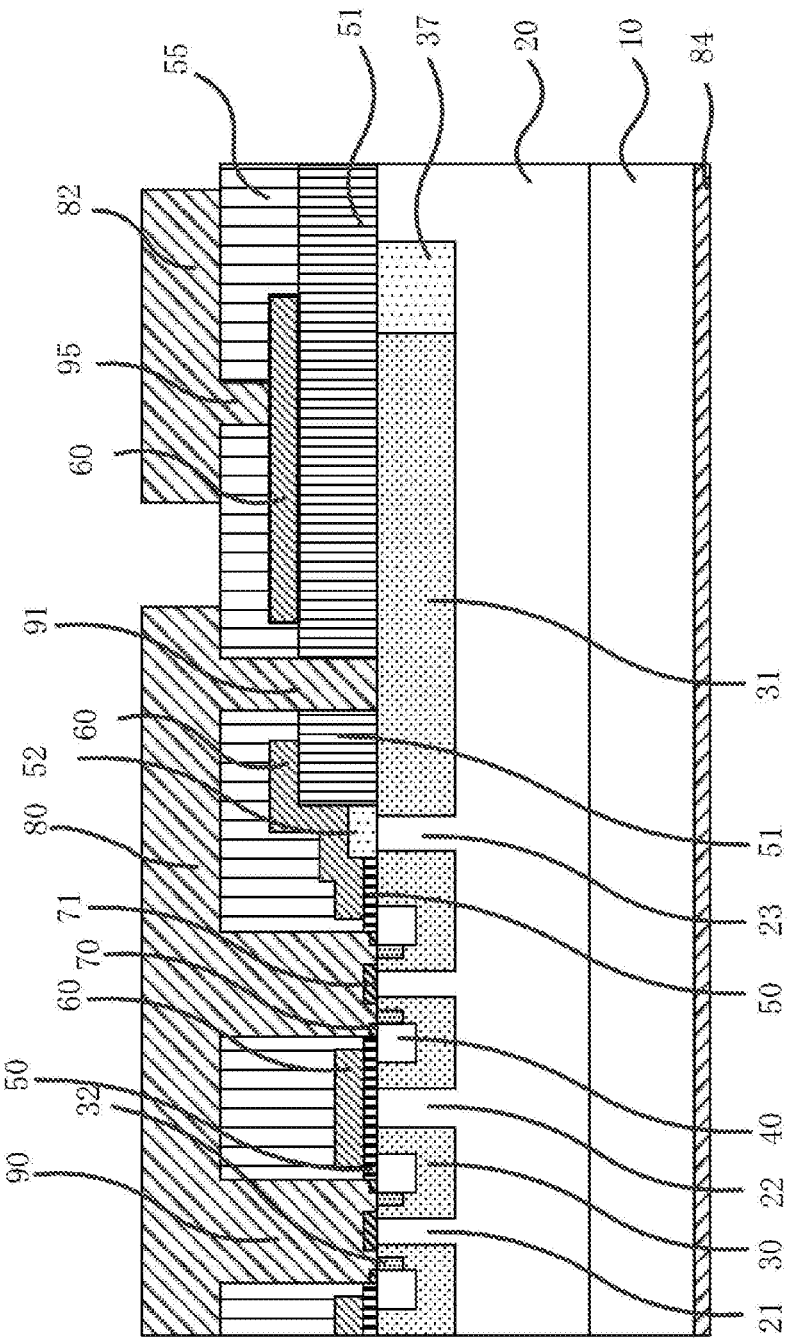
FIG. 2 is a schematic sectional view of the silicon carbide semiconductor device according to Embodiment 1 of this invention.
Figure 3:
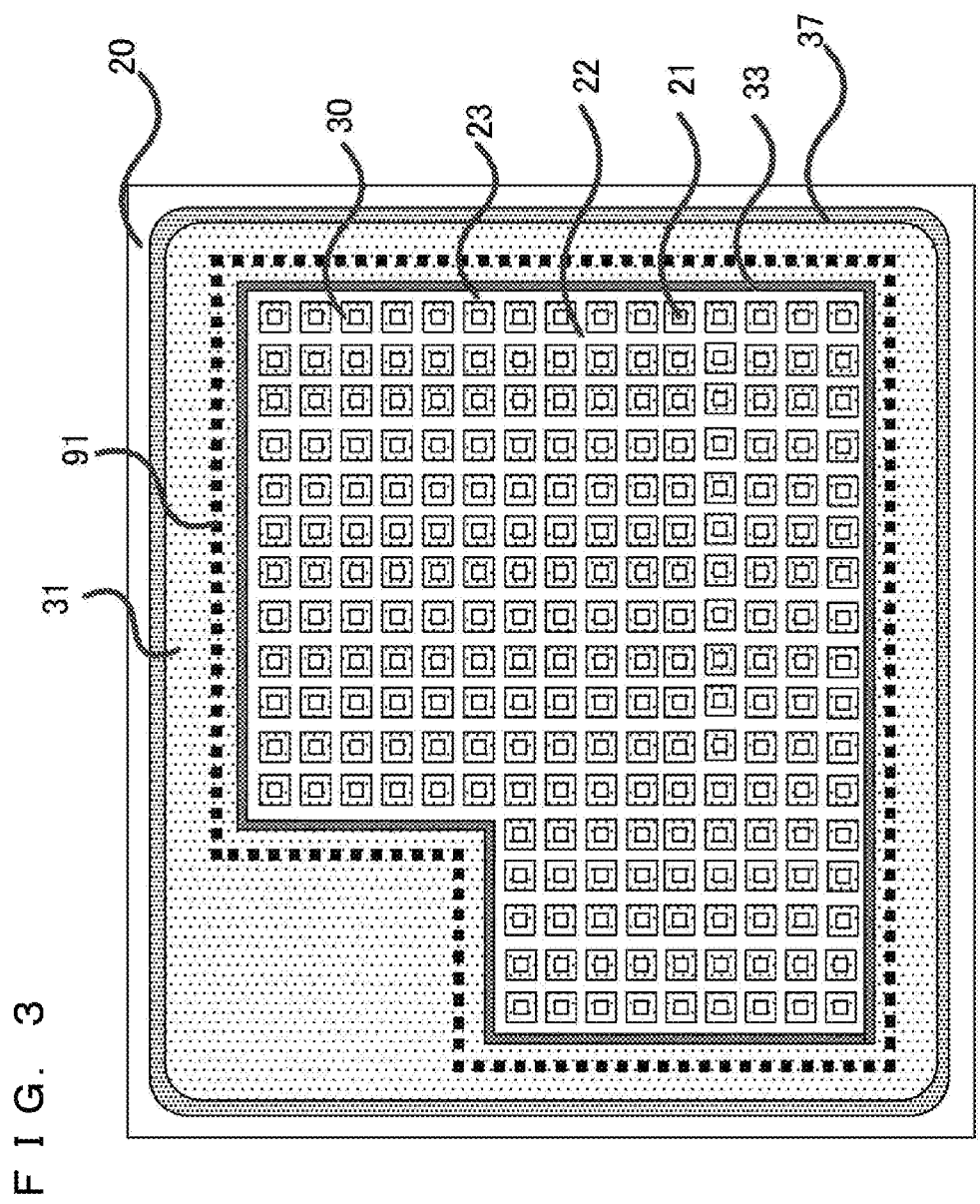
FIG. 3 is a schematic plan view of the silicon carbide semiconductor according to Embodiment 1 of this invention.

FIG. 2 is a schematic sectional view schematically illustrating a cross section corresponding to the line a-a' from the source electrode 80 to the gate line 82 on the periphery of the silicon carbide semiconductor device in FIG. 1. FIG. 3 is a schematic plan view mainly illustrating a silicon carbide semiconductor portion in the top view of FIG. 1.

In FIG. 2, a drift layer 20 made of n-type silicon carbide is formed on a surface of a semiconductor substrate 10 made of silicon carbide of n-type and low resistance. As shown in FIG. 3, a second well region 31 made of p-type silicon carbide is formed in a surface layer area of the drift layer 20 substantially corresponding in position to a region with the gate line 82 described with reference to FIG. 1.

A plurality of first well regions 30 made of p-type silicon carbide are formed in the surface layer area of the drift layer 20 and under a region with the source electrode 80 described with reference to FIG. 1. In a surface layer area of each of the first well regions 30, a source region 40 made of n-type silicon carbide is formed at a position inner than the periphery of the first well region 30 by a predetermined distance.

A contact region 32 made of silicon carbide of low resistance and p-type is formed in the surface layer area of each of the first well regions 30 which is inner than the source region 40 in the surface layer area of the first well region 30. First separation regions 21 made of silicon carbide and further inner than the contact regions 32 are formed through the first well regions 30 from the surface of the drift layer 20. The first separation regions 21 are of n-type similarly to the drift layer 20, and have the same impurity concentration as that of the drift layer 20.

A first Schottky electrode 71 forming a Schottky connection with each of the first separation regions 21 is formed on a surface of the first separation region 21. Here, the first Schottky electrode 71 is preferably formed to include at least the corresponding first separation region 21 when viewed from the top surface.

An ohmic electrode 70 is formed on a surface of the source region 40. The source electrode 80 to be connected to the ohmic electrodes 70, the first Schottky electrodes 71, and the contact regions 32 is formed on the surface of these. The first well regions 30 can easily exchange electrons and holes with the ohmic electrodes 70 through the contact regions 32 of low resistance.

Regions between the adjacent first well regions 30 in the drift layer 20 are second separation regions 22. The second separation regions 22 are of n-type similarly to the drift layer 20, and have the same impurity concentration as that of the drift layer 20. A gate insulating film 50 is formed on the surface of the adjacent first well regions 30, the second separation regions 22 between the adjacent first well regions 30, and the source regions 40 in the first well regions 30. A gate electrode 60 is formed on the gate insulating film 50 at least on the first well regions 30. The surface layer area of the first well regions 30, which is below a portion where the gate electrode 60 is formed and faces the gate electrode 60 through the gate insulating film 50, will be referred to as a channel region.

A region in which the first well regions 30 in the source electrode 80 in FIG. 1 of the silicon carbide semiconductor device is formed is an active region. The second well region 31 is formed outside the active region, that is, outside the first well regions 30 around the outermost circumference. A third separation region 23 is formed between the first well regions 30 and the second well region 31. The third separation region 23 is of n-type similarly to the drift layer 20, and has the same impurity concentration as that of the drift layer 20.

A region outside the region in which the second well region 31 is formed is a terminal region.

A second insulating film 52 made of silicon oxide or silicon nitride and at least double the gate insulating film 50 in width is formed on the third separation region 23 between the second well region 31 and the first well regions 30 around the outermost circumference. Further, a field insulating film 51 is formed on the second well region 31.

The gate electrode 60 to be connected to the gate electrode 60 on the gate insulating film 50 is formed on the second insulating film 52 and on a part of the field insulating film 51. An interlayer insulating film 55 is formed between the gate electrode 60 and the source electrode 80. Further, the gate electrode 60 and the gate line 82 above the second well region 31 are connected with each other through gate contact holes 95 formed in the interlayer insulating film 55. A p-type JTE region 37 made of silicon carbide is formed around the periphery of the second well region 31, specifically, on the opposite side of the first well regions 30. The JTE region 37 is lower in impurity concentration than the second well region 31.

An opening (second contact hole 91) is formed partly in the field insulating film 51 on the surface of the second well region 31. The source electrode 80 connected to, for example, the ohmic electrodes 70 is formed in the opening. Here, the second well region 31 does not have a direct ohmic connection to the source electrode 80, but is insulated from or forms a Schottky connection with the source electrode 80.

In the active region, the source electrode 80 on the ohmic electrodes 70, the first Schottky electrodes 71, and the contact regions 32 is connected to the source electrode 80 on the interlayer insulating film 55 through a first contact hole 90 formed through the interlayer insulating film 55 and the gate insulating film 50.

A drain electrode 84 is formed on a rear surface of the semiconductor substrate 10.

Next, a method for manufacturing the SiC-MOSFET with built-in SBDs as the silicon carbide semiconductor device according to Embodiment 1 will be described. First, the drift layer 20 made of n-type silicon carbide having an impurity concentration from $1\times10^{15}$ to $1\times10^{17}$ cm$^{-3}$ and having a thickness from 5 to 50 μm is epitaxially grown by chemical vapor deposition (CVD) on the semiconductor substrate 10 whose first main surface in one plane direction is a (0001) plane with an off angle, which has a 4H polytype, and which is made of silicon carbide of n-type and low resistance.

Next, an implantation mask is formed in a predetermined region on the surface of the drift layer 20 using, for example, a photoresist. Then, p-type impurities such as aluminum (Al) are ion-implanted. Here, the depth of the ion-implanted Al approximately ranges from 0.5 to 3 μm, which does not exceed the thickness of the drift layer 20. The impurity concentration of the ion-implanted Al ranges from $1\times10^{17}$ to $1\times10^{19}$ cm$^{-3}$, which is higher than that of the drift layer 20. Then, the implantation mask is removed. With this process, the ion-implanted Al region becomes the first well regions 30 and the second well region 31.

Next, an implantation mask is formed on the surface of the drift layer 20 using, for example, a photoresist. Then, p-type impurities, for example, Al are ion-implanted. Here, the depth of the ion-implanted Al approximately ranges from 0.5 to 3 μm, which does not exceed the thickness of the drift layer 20. The impurity concentration of the ion-implanted Al ranges from $1\times10^{16}$ to $1\times10^{18}$ cm$^{-3}$, which is higher than that of the drift layer 20 and lower than that of the first well regions 30. Then, the implantation mask is removed. With this process, the ion-implanted Al region becomes the JTE region 37. Likewise, ion-implanting Al into a predetermined region with an impurity concentration higher than that of the first well regions 30 forms the contact regions 32.

Next, an implantation mask is formed using, for example, a photoresists so that a predetermined portion inside each of the first well regions 30 on the surface of the drift layer 20 is opened. Then, n-type impurities such as nitrogen (N) are ion implanted. The depth of the ion-implanted N is less than the thickness of the first well regions 30. The impurity concentration of the ion-implanted N ranges from $1\times10^{18}$ to $1\times10^{21}$ cm$^{-3}$, which exceeds the p-type impurity concentration of the first well regions 30. N-type regions in the regions where N has been implanted in this process become the source regions 40.

Next, a thermal processing device performs annealing in an inert gas atmosphere such as argon (Ar) at a temperature from 1300 to 1900° C. for 30 seconds to 1 hour. This annealing electrically activates the ion implanted N and Al.

Then, the field insulating film 51 made of silicon oxide and having a thickness from 0.5 to 2 µm is formed by, for example, CVD or a photolithography technique on the semiconductor layer in a region other the active region which substantially corresponds to a region where the first well regions 30 are formed.

Further, the second insulating film 52 made of silicon oxide and 0.1 to 0.5 µm thick is formed by, for example, CVD or a photolithography technique on the third separation region 23 between the second well region 31 and the first well regions 30 around the outermost circumference.

Next, the surface of silicon carbide that is not covered with the field insulating film 51 and the second insulating film 52 is thermally oxidized to form a silicon oxide film as the gate insulating film 50 with a desired thickness. Then, a polycrystalline silicon film having conductivity is formed by low pressure CVD on the gate insulating film 50, the second insulating film 52, and the field insulating film 51, and is patterned to form the gate electrode 60. Next, the interlayer insulating film 55 made of silicon oxide is formed by low pressure CVD. Then, the first contact hole 90 is formed through the interlayer insulating film 55 and the gate insulating film 50 to reach the contact regions 32 and the source regions 40 in the active region. At the same time, the second contact hole 91 is formed to reach the second well region 31.

Next, a metal film mainly containing Ni is formed by, for example, sputtering. Then, the metal film is subjected to a thermal process at a temperature from 600 to 1100° C. so that the metal film mainly containing Ni reacts with a silicon carbide layer in the first contact hole 90, thereby forming a silicide between the silicon carbide layer and the metal film. Next, the residual metal film other than the silicide resulting from the reaction is removed by wet etching. Consequently, the ohmic electrodes 70 are formed.

Then, a metal film mainly containing Ni is formed on the rear surface (second main surface) of the semiconductor substrate 10 and thermally processed, thereby forming a rear surface ohmic electrode (not illustrated) on the rear side of the semiconductor substrate 10.

Next, portions of the interlayer insulating film 55 and the gate insulating film 50 on the first separation regions 21, and portions of the interlayer insulating film 55 at positions where the gate contact holes 95 are to be formed are removed by patterning using, for example, a photoresist. The removing method is wet-etching that does not damage the surface of the silicon carbide layer to be the Schottky interface.

Then, a metal film to be formed into Schottky electrodes is deposited by, for example, sputtering. Then, the first Schottky electrodes 71 are formed on the first separation regions 21 in the first contact hole 90 by patterning using, for example, a photoresist.

Next, a wiring metal made of, for example, Al is formed by sputtering or vapor deposition on the surface of the substrate that is being processed so far, and is processed into a predetermined shape by a photolithographic technique to form the source electrode 80 in contact with the ohmic electrodes 70, the first Schottky electrodes 71, and the second well region 31 for the source and form the gate pad 81 and the gate line 82 that are in contact with the gate electrode 60.

Further, the drain electrode 84 is formed as a metal film on the surface of the rear surface ohmic electrode (not illustrated) formed on the rear surface of the substrate, thus completing the fabrication of the silicon carbide semiconductor device according to Embodiment 1 that is illustrated in FIGS. 1 to 3.

Next, operations of the SiC-MOSFET with built-in SBDs as the silicon carbide semiconductor device according to Embodiment 1 will be described Here, an example silicon carbide semiconductor device made of 4H-type silicon carbide as a semiconductor material will be described. In this case, a diffusion potential at a p-n junction is approximately 2 V.

Hereinafter, free-wheeling operations will be mainly described.

A voltage of several volts is generated in the free-wheeling operations, as a drain voltage (a voltage at the drain electrode 84) is lower than a source voltage (a voltage at the source electrode 80). Since SBDs that are turned ON with a voltage lower than that of the first well regions 30 are formed between the first separation regions 21 and the first Schottky electrodes 71 in the active region, in principle, the freewheeling current flows not through the first well regions 30 but through the SBDs. When the terminal region includes the source electrode 80 having an ohmic connection to the second well region 31 through the ohmic electrodes 70, much of the voltage between the source and the drain is applied to the p-n junction formed between the second well region 31 and the drift layer 20, thereby causing a bipolar current to flow through the p-n diode formed by the second well region 31 and the drift layer 20. However, the second well region 31 does not have an ohmic connection to the source electrode 80 in the silicon carbide semiconductor device according to the present invention. Further, the second insulating film 52 at least double the gate insulating film in width is formed on the third separation region 23. In addition, the entire second well region 31 is covered with an insulating film thicker than the gate insulating film 50 (the second insulating film 52 and the field insulating film 51).

Thus in the silicon carbide semiconductor device according to Embodiment 1, the second well region 31 and the source electrode 80 do not have the same potential during the free-wheeling operations, so that bipolar operations in the second well region 31 can be suppressed. Moreover, an electric field to be applied to an insulating film with a voltage generated on the second well region 31 in turn-off and turn-on operations can be reduced, and dielectric breakdown in the insulating film on the second well region 31 can be suppressed, which can enhance the reliability.

Next, operations of the terminal region of the silicon carbide semiconductor device according to Embodiment 1 in switching operations will be described.

First, the drain voltage increases in a turn-off operation. Then, a depletion layer rapidly spreads in the drift layer 20. The depletion layer also spreads in the second well region 31 to correspond to the spread of the depletion layer in the drift layer 20. A displacement current corresponding to the spread of the depletion layer flows from the second well region 31 toward the source electrode 80. Although the displacement current flows from the second well region 31 toward the source electrode 80 through the second contact hole 91, the source electrode 80 is insulated from or forms a Schottky connection with the second well region 31.

When the source electrode 80 forms a Schottky connection with the second well region 31 in the second contact hole 91, a forward current flowing from the second well region 31 toward the source electrode 80 does not generate a voltage high enough to break the insulating film on the second well region 31. Further, even when the source electrode 80 is insulated from the second well region 31 in the second contact hole 91, if the insulating film between the source electrode 80 and the second well region 31 is thin, breakdown occurs with application of a certain voltage or more. Thus, a voltage high enough to break the insulating film on the second well region 31 is not generated. Here, since the source electrode 80 is spatially closely adjacent to the second well region 31, a parasitic capacitance in the contact portion greatly increases. Thus, the displacement current can flow from the second well region 31 to the source electrode 80 with a small voltage drop though this large parasitic capacitance.

Next, the turn-on operations will be described. In the turn-on operations, the drain voltage rapidly decreases. Here, the depletion layer formed between the drift layer 20 and the second well region 31 in an OFF state rapidly shrinks. Thus, the displacement current flows from the source electrode 80 into the second well region 31.

When the source electrode 80 forms a Schottky connection with the second well region 31 in the second contact hole 91, the current flows, during the turn-on operations, in a direction reverse to the forward direction of the current flowing through the SBDs formed between the second well region 31 and the source electrode 80. The voltage generated on the second well region 31 can be reduced to lower than or equal to a voltage at which the insulating film on the second well region 31 is broken, by configuring these SBDs to undergo breakdown in the SBDs with application of a certain reverse voltage.

This applies when the source electrode 80 is insulated from the second well region 31. The voltage generated on the second well region 31 can be reduced to lower than or equal to a voltage at which the insulating film on the second well region 31 is broken by designing a voltage to be applied when the dielectric breakdown occurs to a certain voltage or less. Further, since the source electrode 80 is spatially closely adjacent to the second well region 31, the parasitic capacitance in the contact portion is so large that passage of a transient current though this parasitic capacitance allows the displacement current to flow from the second well region 31 to the source electrode 80 with a small voltage drop. This can adequately prevent a voltage at which the insulating film on the second well region 31 is broken from being generated on the second well region 31.

Figure 4:
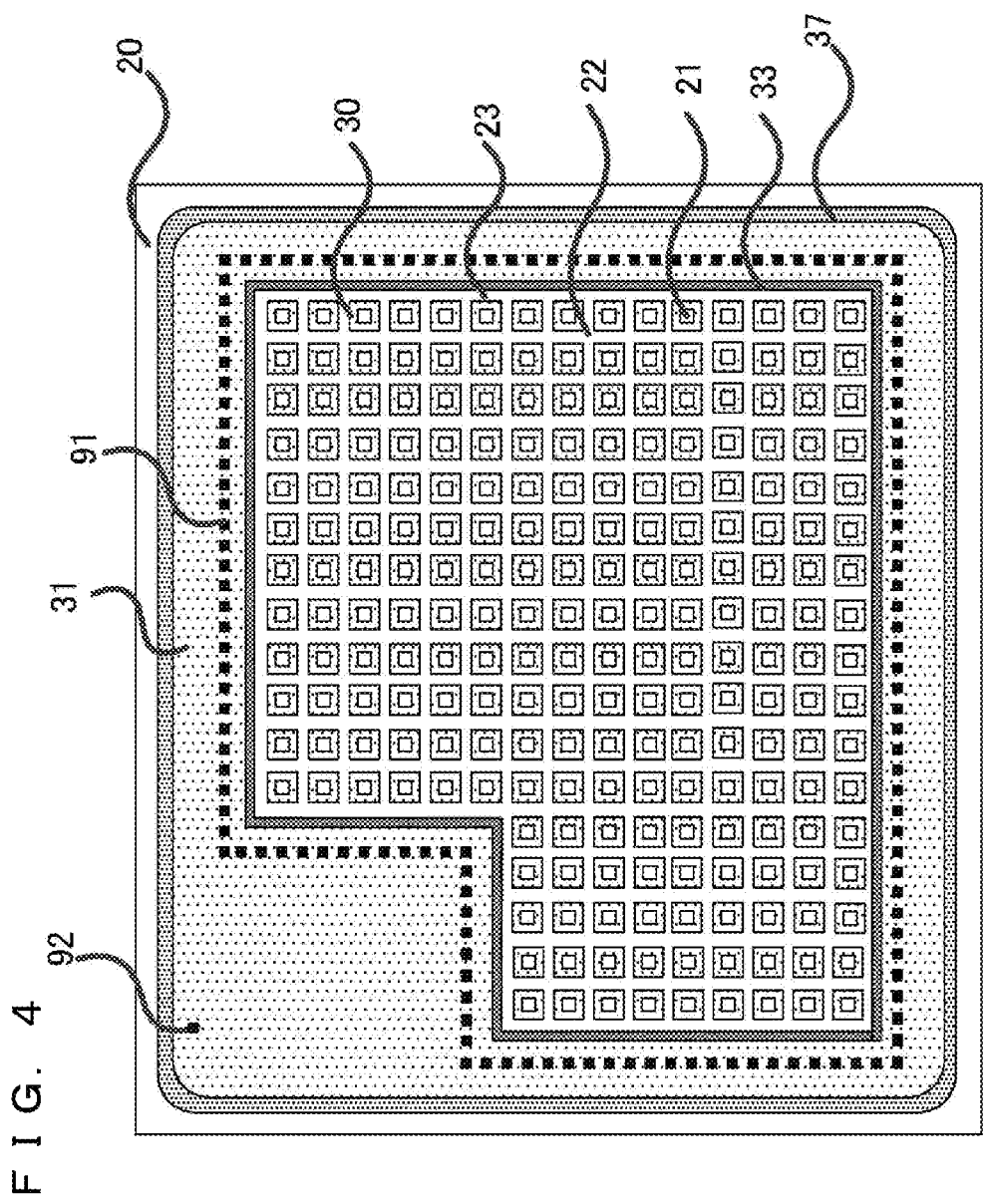
FIG. 4 is a schematic plan view of a silicon carbide semiconductor device with another structure according to Embodiment 1 of this invention.
Figure 5:
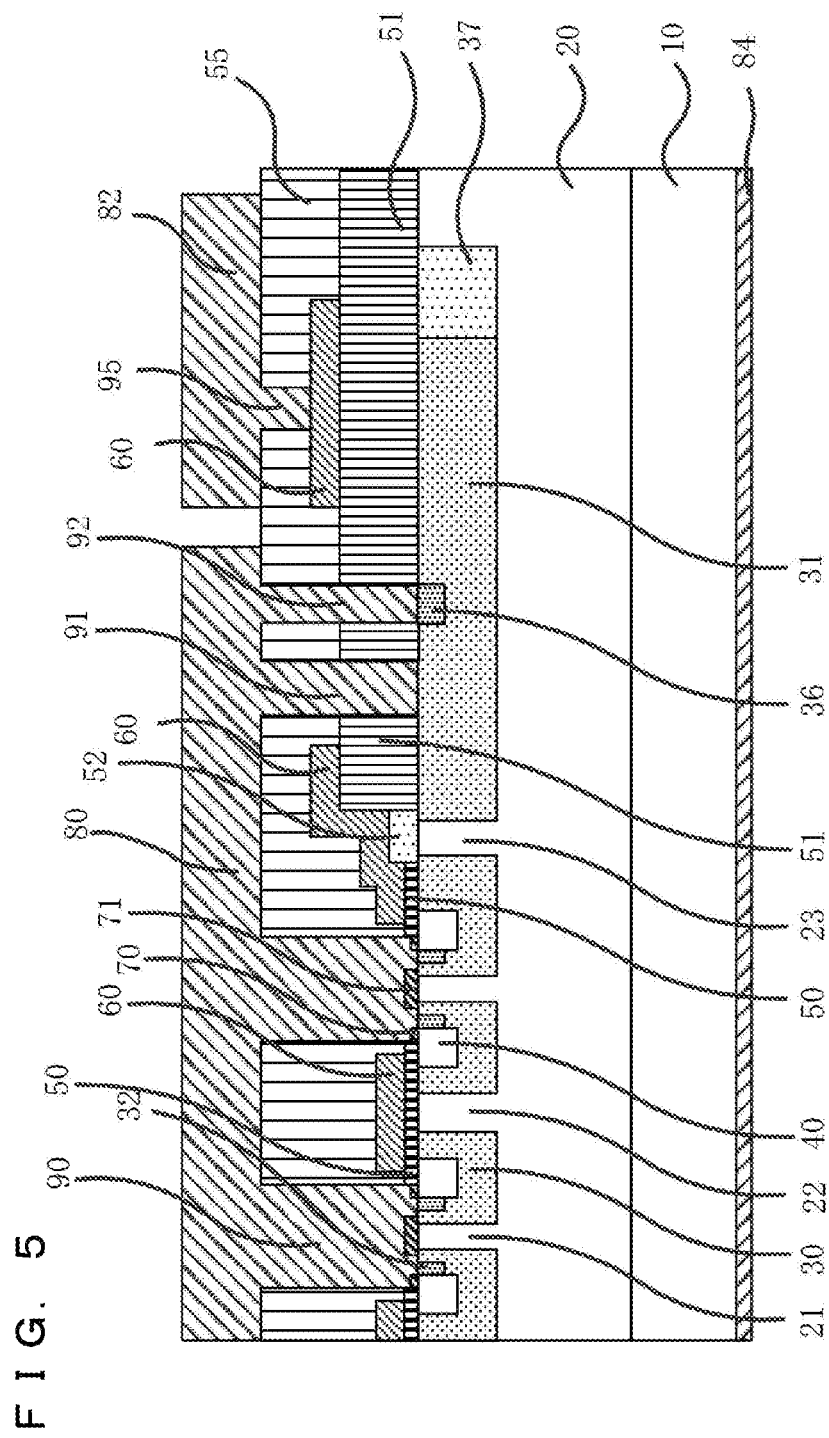
FIG. 5 is a schematic sectional view of the silicon carbide semiconductor device with another structure according to Embodiment 1 of this invention.

FIG. 4 is a schematic plan view mainly illustrating a silicon carbide semiconductor portion in the silicon carbide semiconductor device with another feature according to Embodiment 1. In FIG. 4, a second-well-region contact hole 92 having an ohmic connection to the second well region 31 and the source electrode 80 is formed in a portion of the second well region 31. FIG. 5 is a schematic sectional view illustrating a cross section including the portion in which the second-well-region contact hole 92 in FIG. 4 is formed. In FIG. 5, the second-well-region contact hole 92 is formed through the field insulating film 51 and the interlayer insulating film 55. The second well region 31 under the second-well-region contact hole 92 may include a second well contact region 36 higher in p-type impurity concentration and lower in resistance than the second well region 31.

The second-well-region contact hole 92 is formed on the shortest path in the second well region 31 at a distance of 10 µm or more from the second contact hole 91 in the cross-lateral direction. Here, a portion in the second well region 31 at a distance of 10 µm or more from the second-well-region contact hole 92 is regarded as having substantially a non-ohmic connection. More preferably, the distance between the second contact hole 91 and the second-well-region contact hole 92 on the shortest path in the second well region 31 should be 50 µm or more.

Figure 6:
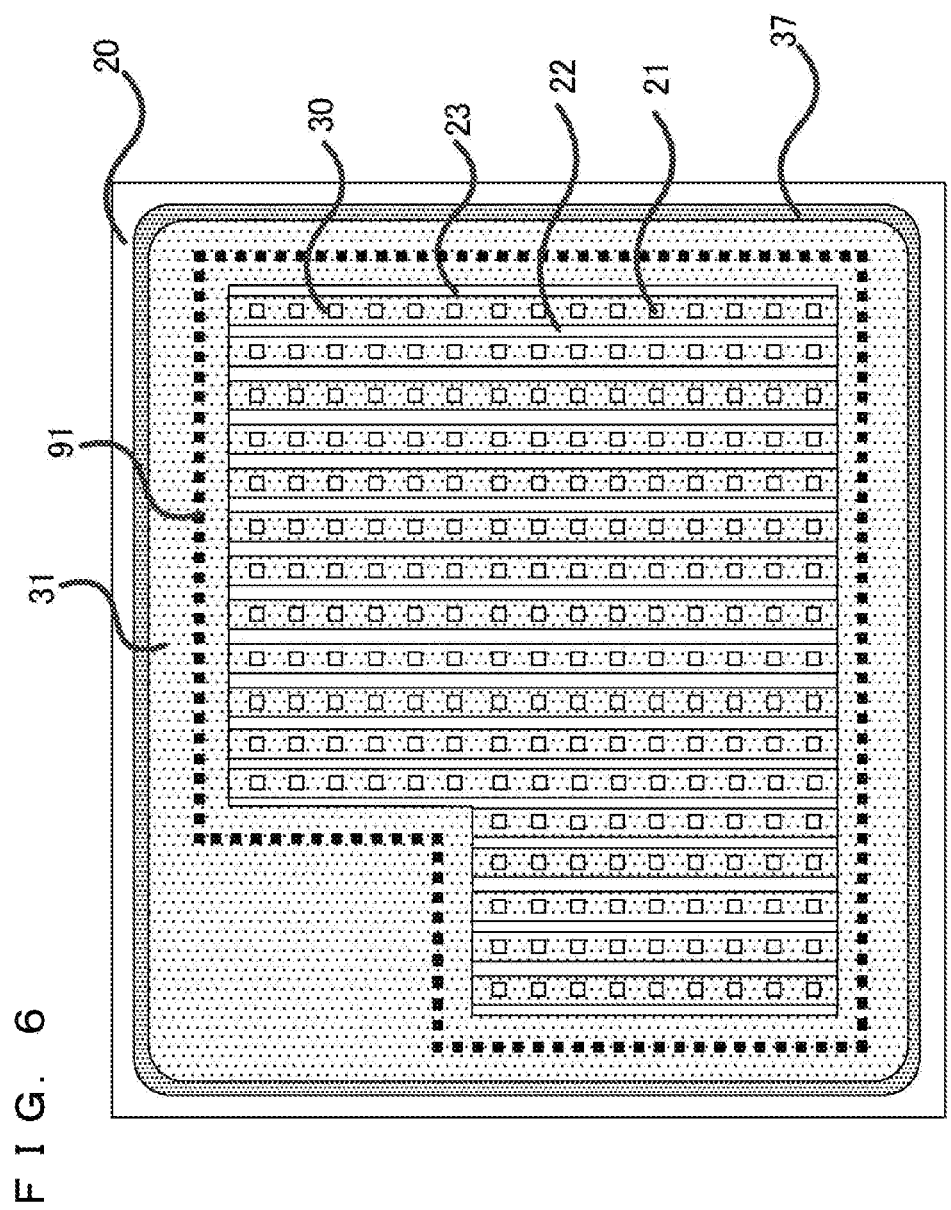
FIG. 6 is a schematic plan view of a silicon carbide semiconductor device with another structure according to Embodiment 1 of this invention.

Although what is described so far is that the first well regions 30 are basically separated from the second well region 31, the first well regions 30 may be connected to the second well region 31. Furthermore, although described is the plurality of first well regions 30 that are separated from each other, the first well regions 30 may be connected to each other. FIG. 6 is a schematic plan view when the first well regions 30 are connected to the second well region 31 and the first well regions 30 are connected to each other.

Here, each of the first well regions 30 is at a distance of 50 µm or less either from the source region 40 in the first well region 30 or from the first Schottky electrode 71 formed on the first separation region 21 in the first well region 30.

Figure 7:
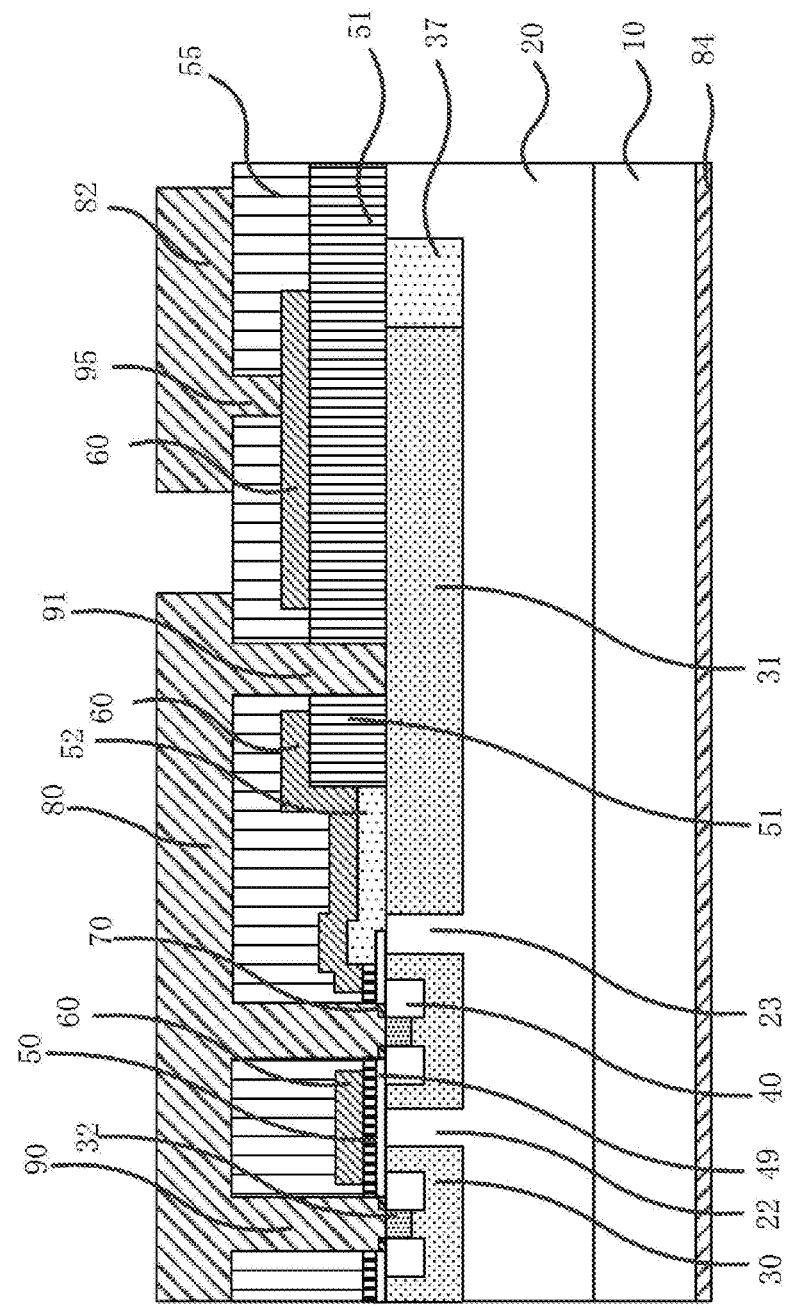
FIG. 7 is a schematic sectional view of a silicon carbide semiconductor device with another structure according to Embodiment 1 of this invention.

Although Embodiment 1 describes an example in the presence of a MOSFET with built-in SBDs in the active region, the MOSFET with built-in SBDs may be replaced with a MOSFET including an n-type channel epitaxial layer 49 on a p-type well region. This MOSFET may be designed so that the channel epitaxial layer 49 functions as unipolar diodes with a gate voltage lower than or equal to a threshold voltage and a turn-on voltage of the unipolar diodes is lower than an operating voltage of a p-n diode formed by the p-type well region and an n-type drift layer. FIG. 7 is a schematic sectional view of such a MOSFET that replaces the MOSFET with built-in SBDs in FIG. 2. Consequently, application of a reverse current to a channel region in the MOSFET during the free-wheeling operations can produce the same advantages as those of the MOSFET with built-in SBDs.

Figure 8:
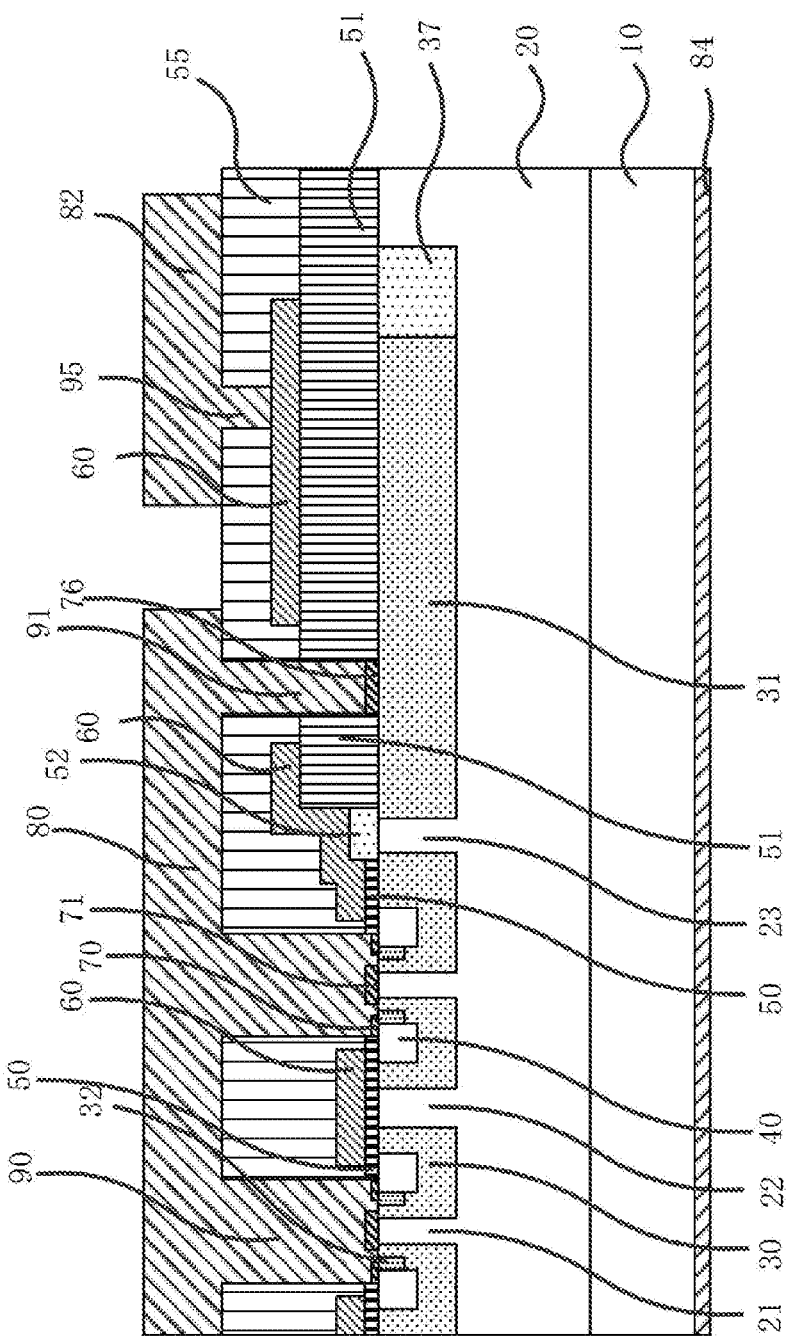
FIG. 8 is a schematic sectional view of a silicon carbide semiconductor device with another structure according to Embodiment 1 of this invention.

Further, the second well region 31 forms a Schottky connection with the source electrode 80 through a second Schottky electrode 76 in the second contact hole 91. FIG. 8 is a schematic sectional view of the silicon carbide semiconductor device according to Embodiment 1 in which the second well region 31 is connected to the source electrode 80 through the second Schottky electrode 76.

Since a Schottky connection formed between the second well region 31 and the source electrode 80 causes holes that are majority carriers of the second well region 31 to flow toward the source electrode 80 as a forward current of a Schottky diode in a turn-off operation. Thus, even when a displacement current flows through a contact portion between the second well region 31 and the source electrode 80 in turn-off by high-speed switching, the voltage generated by the displacement current and an electric field to be applied to the insulating film on the second well region 31 can be reduced. This can enhance the reliability of elements.

The advantages of the present invention will be more prominent when the gate voltage in turn-off is driven by a voltage lower than a source voltage.

Embodiment 2

A silicon carbide semiconductor device according to Embodiment 2 includes a layer of low resistance in the cross-lateral direction of the second well region 31 of the silicon carbide semiconductor device according to Embodiment 1. Since the other features are the same as those according to Embodiment 1, the detailed description will be omitted.

Figure 9:
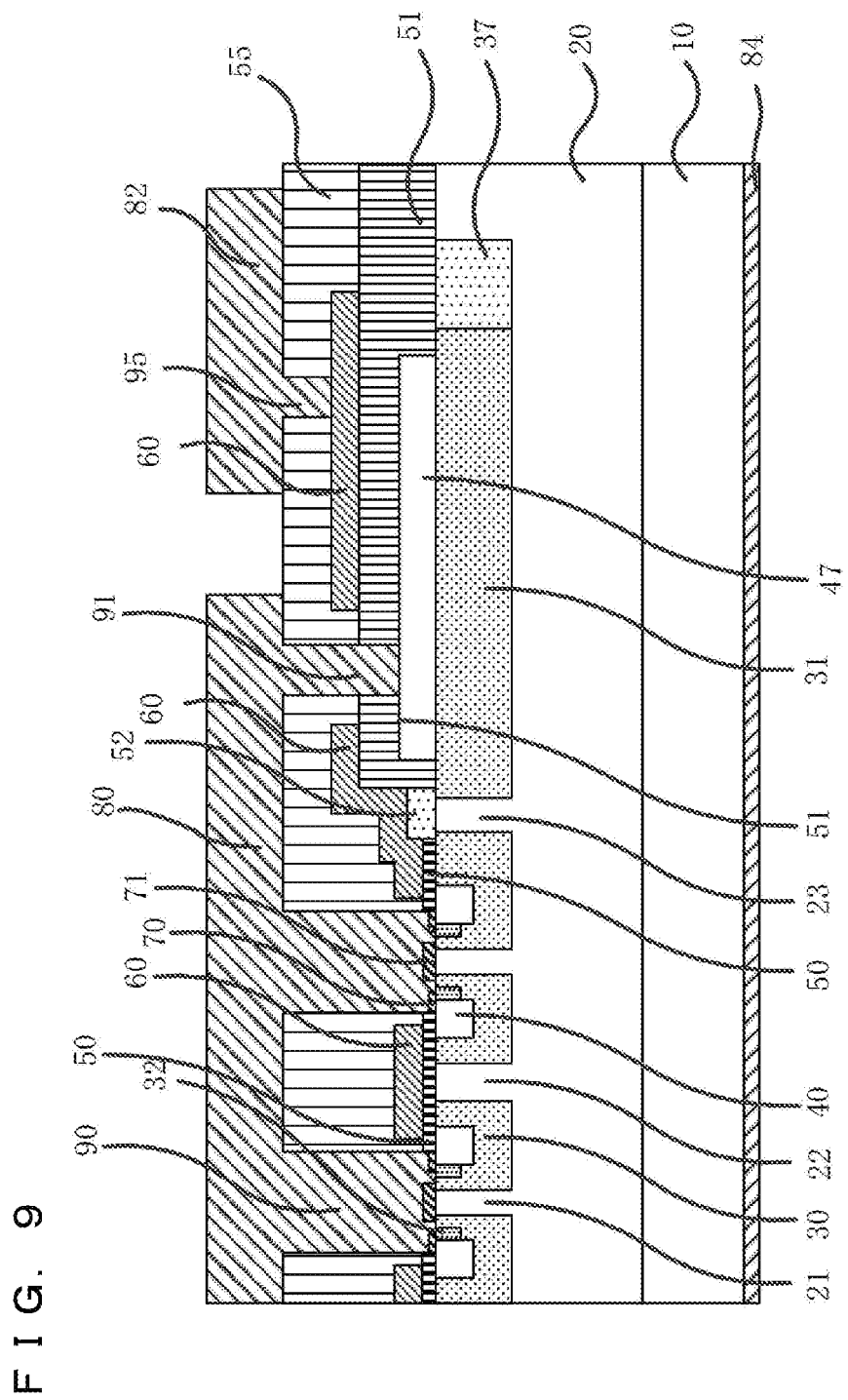
FIG. 9 is a schematic sectional view of a silicon carbide semiconductor device according to Embodiment 2 of this invention.
Figure 10:
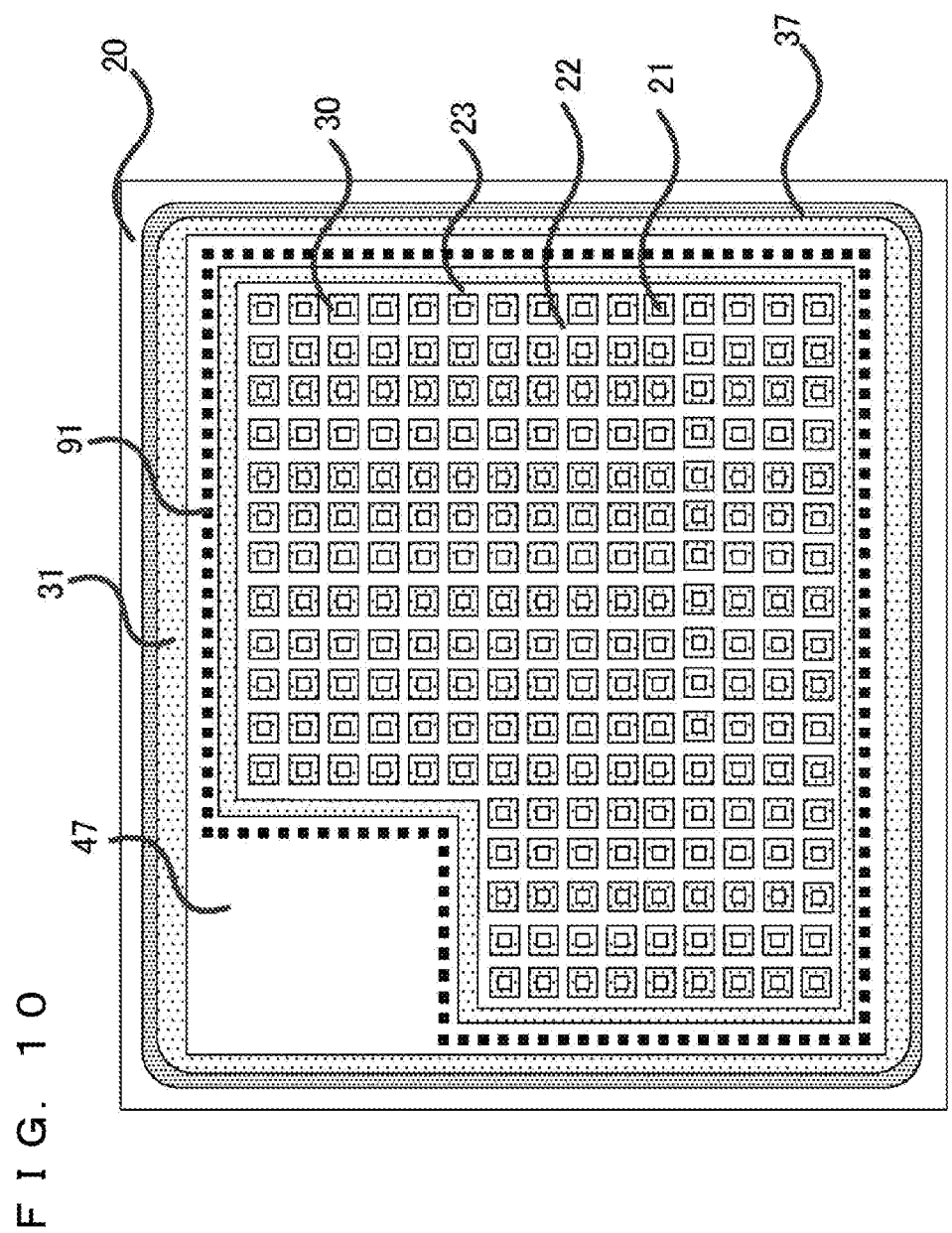
FIG. 10 is a schematic plan view of the silicon carbide semiconductor according to Embodiment 2 of this invention.

FIG. 9 is a schematic sectional view of the silicon carbide semiconductor device according to Embodiment 2 schematically illustrating a cross section corresponding to the line a-a' from the source electrode 80 to the gate line 82 on the periphery of the silicon carbide semiconductor device described with reference to FIG. 1 according to Embodiment 1. FIG. 10 is a schematic plan view of the silicon carbide semiconductor device according to Embodiment 2.

The terminal region of the silicon carbide semiconductor device according to Embodiment 2 whose sectional view is illustrated in FIG. 9 includes a conductive layer 47 of low resistance on the second well region 31 of the second conductivity type without an ohmic connection to the second well region 31. For example, the conductive layer 47 forms a Schottky connection with the second well region 31. The second contact hole 91, which is formed on the second well region 31 according to Embodiment 1, is formed on the conductive layer 47 according to Embodiment 2. The source electrode 80 formed in the second contact hole 91 has an ohmic connection to the conductive layer 47.

Further, the conductive layer 47 is formed in a region on the plane of the second well region 31 with a large proportion as FIG. 10 illustrates the plan view. The region where the conductive layer 47 is formed should be 50% or more of the region where the second well region 31 is formed.

The conductive layer 47 should be made of polycrystalline silicon of n-type and low resistance, and is formed by, for example, low pressure CVD before the field insulating film 51 and the second insulating film 52 are formed. The conductive layer 47 made of polycrystalline silicon of n-type and low resistance forms a Schottky connection with the second well region 31 made of p-type silicon carbide because the valence band and the conduction band of silicon generally belong to a band gap of silicon carbide. As such, the non-ohmic connection between the second well region 31 and the conductive layer 47 disables holes that are majority carriers from being implanted from the source electrode 80 side to the second well region 31 during the free-wheeling operations. Thus, the passage of the bipolar current between the second well region 31 and the drift layer 20 can be suppressed.

Further, the second insulating film 52 thicker than the gate insulating film 50 is formed on the third separation region 23 between the first well regions 30 around the outermost circumference in the active region and the second well region 31 in the terminal region. This prevents the parasitic p-MOSFET between the first well regions 30 and the second well region 31 in the terminal region from being turned ON.

Further, the conductive layer 47 of low resistance that is formed on the second well region 31 can reduce the resistance of the second well region 31 in the cross-lateral direction. The displacement current flowing in the cross-lateral direction of the second well region 31 in high-speed switching can reduce the voltage generated in the second well region 31. These can prevent the element breakdown caused by the voltage generated by the displacement current, and enhance the reliability of the silicon carbide semiconductor device. Further, since the voltage generated by the displacement current increases according the switching speed, the switching speed can be increased more than that when the conductive layer 47 of low resistance is not formed.

In addition, the capacitance of a depletion layer formed between the second well region 31 and the conductive layer 47 can reduce the voltage generated by being charged up, for example, in turn-on, and further enhance the reliability of the elements.

Figure 11:
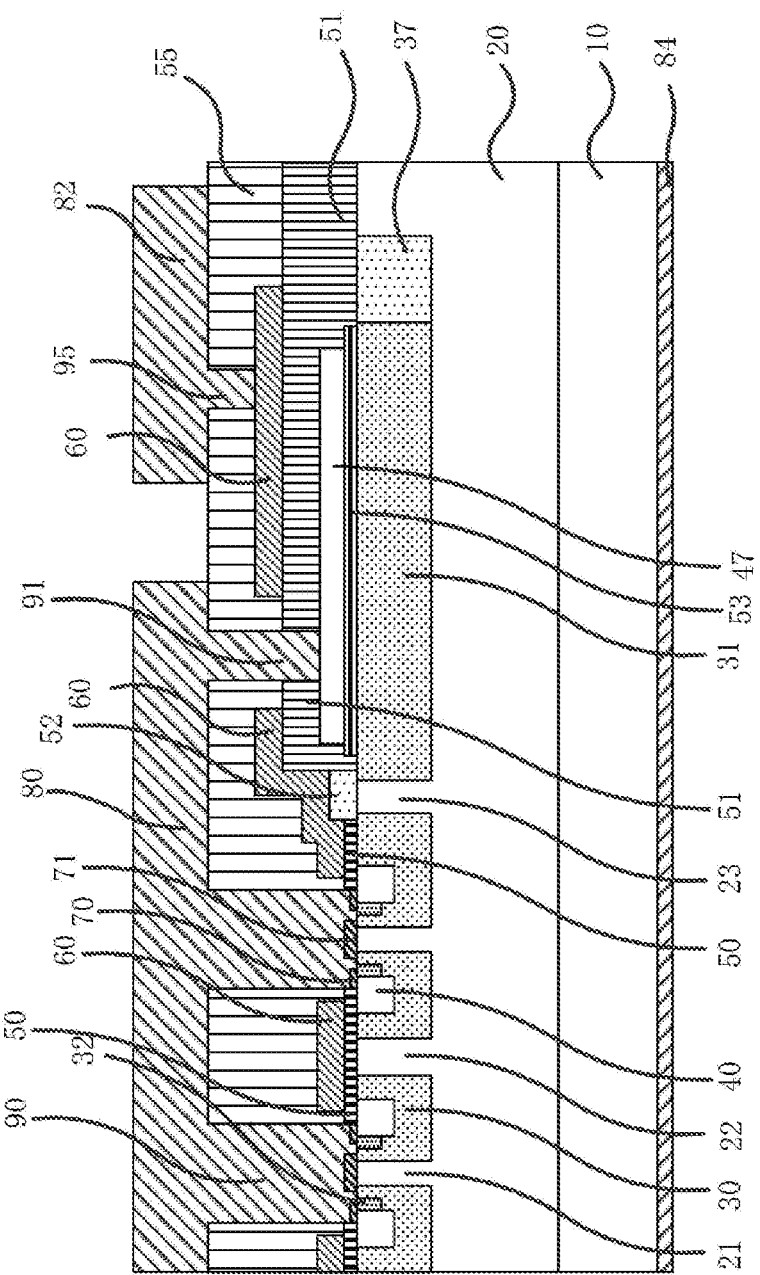
FIG. 11 is a schematic sectional view of a silicon carbide semiconductor device with another structure according to Embodiment 2 of this invention.

The layer of low resistance in the cross-lateral direction of the second well region 31 of the silicon carbide semiconductor device according to Embodiment 1 need not be formed in direct contact with the second well region 31. As FIG. 11 illustrates the schematic sectional view, the conductive layer 47 may be formed on the second well region 31 through an insulating layer 53. A planar layout of the conductive layer 47 may be the same as that in FIG. 10. Thinning the insulating layer 53 can increase the capacitive coupling between the upper and lower portions of the insulating layer 53.

When the insulating layer 53 and the gate insulating film 50 are formed simultaneously with the same thickness, the insulating layer 53 should be formed on the second well region 31 by thermal oxidation, and then the conductive layer 47 should be formed on the insulating layer 53 by, for example, low pressure CVD.

This capacitor functions as a current path for passing the displacement current through the second well region 31 in the plane direction as an AC, with application of dV/dt in turn-on/turn-off. This capacitor works as the capacitance of the depletion layer between the second well region 31 and the conductive layer 47 when the Schottky junction formed between them in the silicon carbide semiconductor device with the structure in FIG. 9 is reverse-biased. Thus, the voltage generated by the displacement current in switching voltages can be similarly suppressed. Further, charging positive charges generated in the second well region 31 immediately after tuning OFF into the capacitor between the second well region 31 and the conductive layer 47 can reduce the voltage generated in the second well region 31 and prevent the dielectric breakdown of the insulating film formed on the second well region 31.

Although the conductive layer 47 of the silicon carbide semiconductor device in each of FIGS. 9 and 11 is described as being made of polycrystalline silicon, it may be made of a metal, a semiconductor such as silicon carbide, or a semimetal such as graphite. When the conductive layer 47 is made of a material other than metals, implantation of majority carriers into the second well region 31 during the free-wheeling operations should be avoided by making the conductive layer 47 form a Schottky connection or a non-linear contact with the second well region 31.

Figure 12:
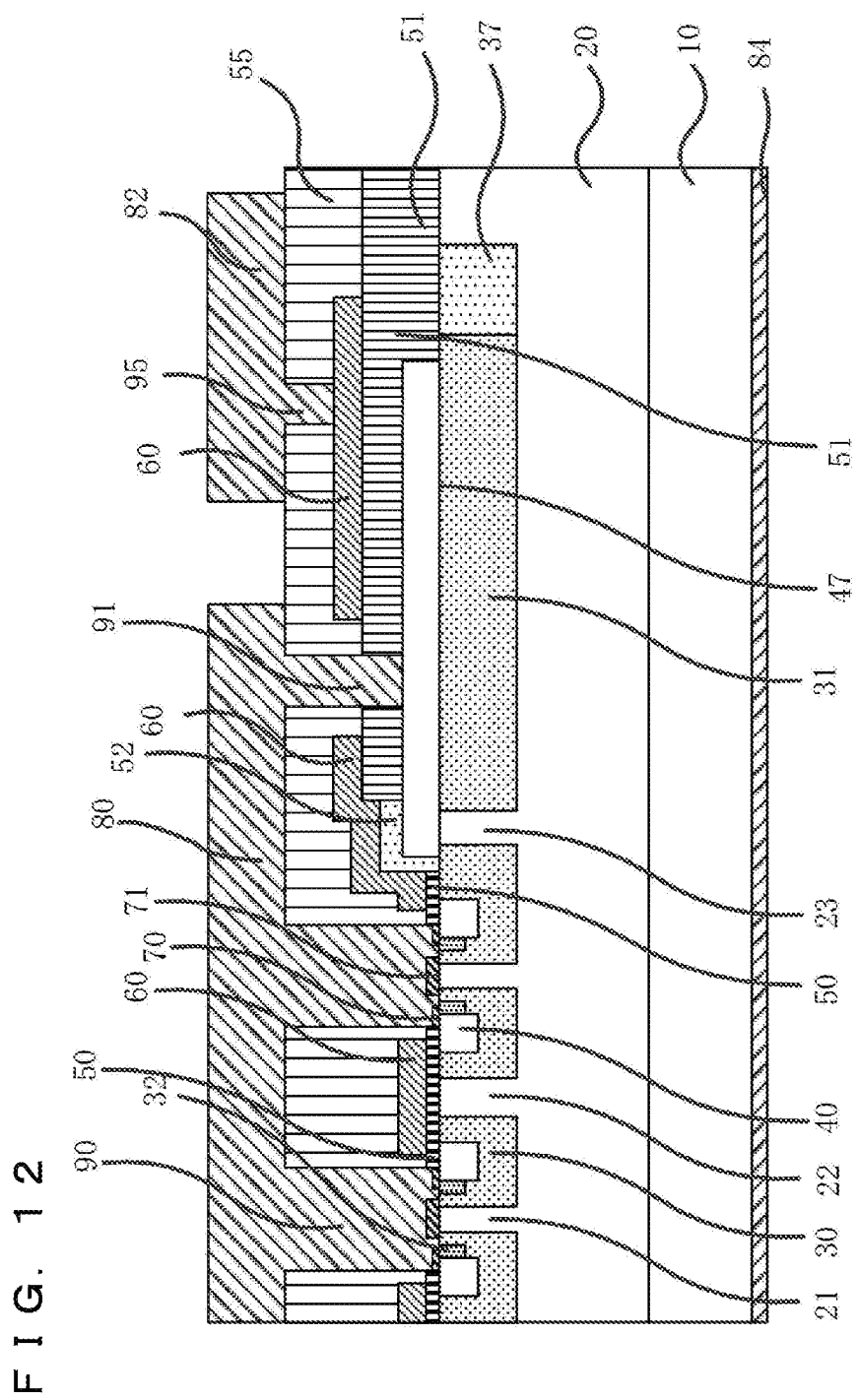
FIG. 12 is a schematic sectional view of a silicon carbide semiconductor device with another structure according to Embodiment 2 of this invention.

The conductive layer 47 may be also formed on the third separation region 23 in a boundary between the first well regions 30 and the second well region 31. FIG. 12 is a schematic sectional view of the conductive layer 47 formed also on the third separation region 23. Here, the second insulating film 52 is formed on the conductive layer 47.

The conductive layer 47 should have a non-ohmic connection to the third separation region 23 of the first conductivity type in the silicon carbide semiconductor device with the structure illustrated in FIG. 12.

Further, the layer of low resistance in the cross-lateral direction of the second well region 31 of the silicon carbide semiconductor device according to Embodiment 2 may be a silicon carbide semiconductor layer formed in an upper layer area of the second well region 31.

Figure 13:
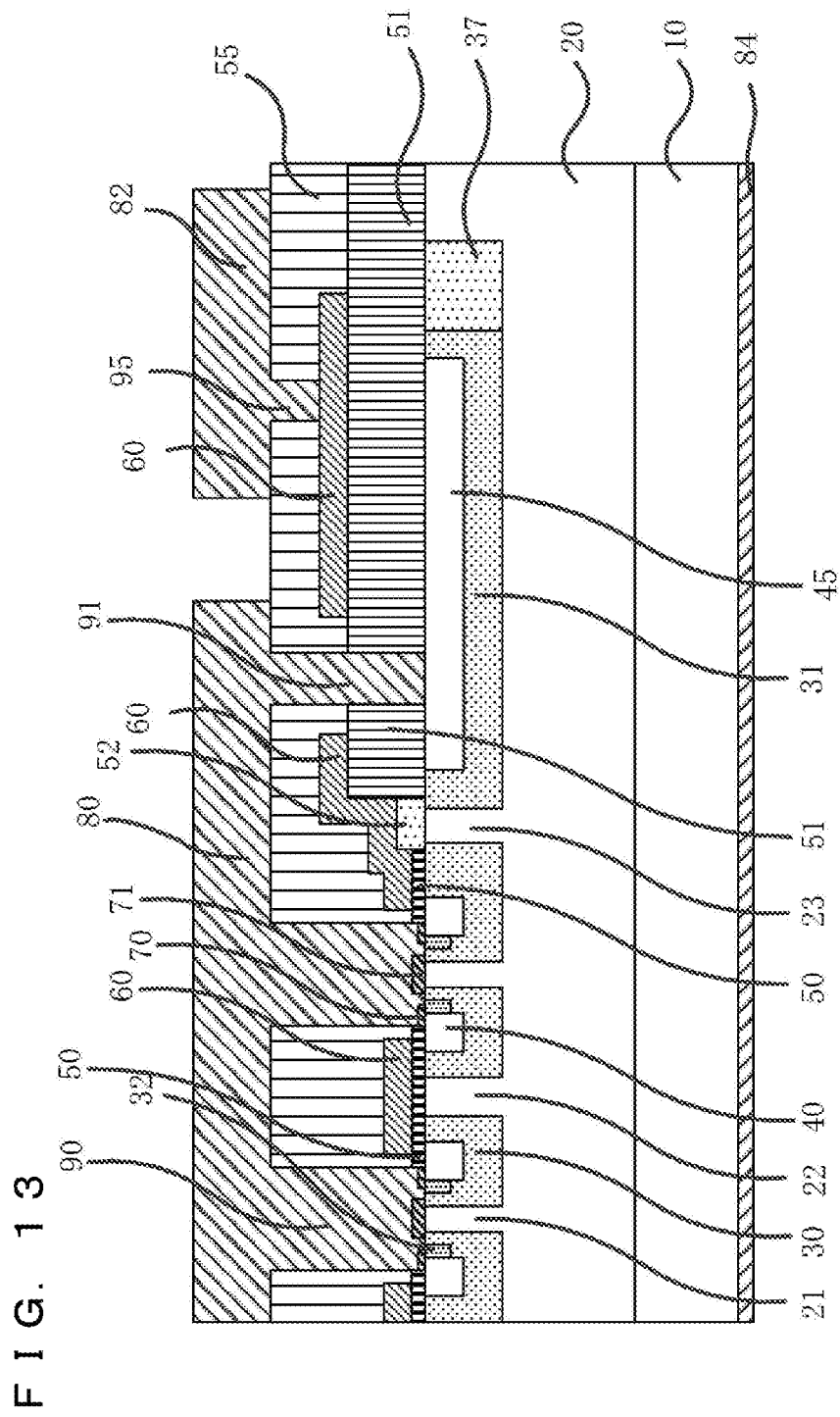
FIG. 13 is a schematic sectional view of a silicon carbide semiconductor device with another structure according to Embodiment 2 of this invention.

As FIG. 13 illustrates the schematic sectional view, a silicon carbide conductive layer 45 of n-type and low resistance may be formed in the upper layer area of the second well region 31. Making the silicon carbide conductive layer 45 lower in resistivity than the second well region 31 produces the same advantages as those of the silicon carbide semiconductor device with the structure illustrated in FIG. 8. A p-n junction is formed between the silicon carbide conductive layer 45 and the second well region 31. The capacitance of the depletion layer in this p-n junction works in the same manner as the structure illustrated in FIG. 8.

The silicon carbide conductive layer 45 of the silicon carbide semiconductor device with the structure illustrated in FIG. 13 should be formed by implanting donor ions such as nitrogen. The manufacturing processes may be reduced by forming the silicon carbide conductive layer 45 simultaneously with the source regions 40 through implanting ions.

Further, the silicon carbide conductive layer 45 may be epitaxially formed.

Since the silicon carbide conductive layer 45 of the first conductivity type or the conductive layer 47 is formed partly in or on the surface layer of the second well region 31, respectively, in the silicon carbide semiconductor device according to Embodiment 2, the resistance of the second well region 31 in a plane lateral direction and a voltage generated by a displacement current flowing through the second well region 31 when the silicon carbide semiconductor device is turned ON/OFF can be reduced, in addition to the aforementioned advantages of the structure according to Embodiment 1. Thus, the reliability can be enhanced more significantly.

Embodiment 3

Although the second insulating film is formed on the third separation region 23 according to Embodiment 1, the field insulating film 51 is formed on the third separation region 23 in a silicon carbide semiconductor device according to Embodiment 3. Since the other features are the same as those according to Embodiments 1 and 2, the detailed description will be omitted.

Figure 14:
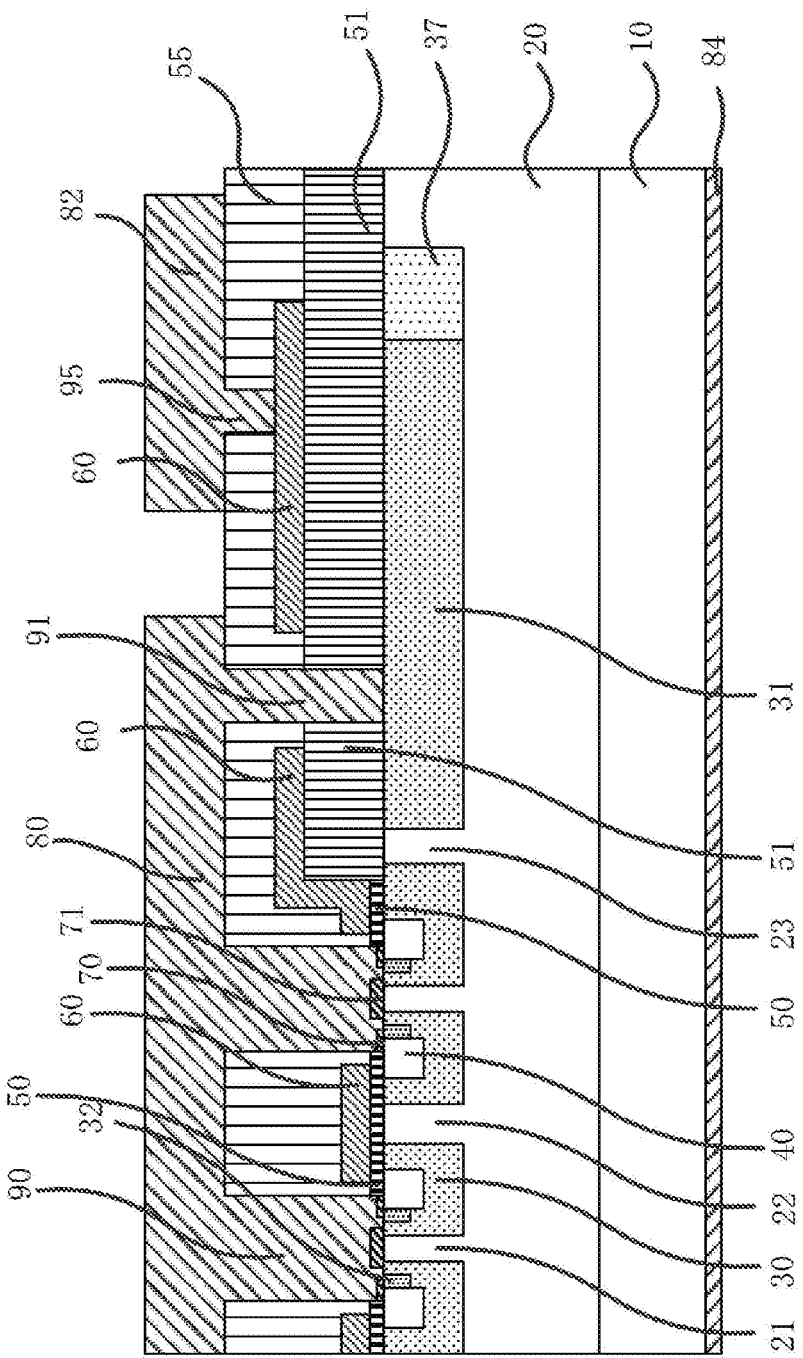
FIG. 14 is a schematic sectional view of a silicon carbide semiconductor device according to Embodiment 3 of this invention.

FIG. 14 is a schematic sectional view of the silicon carbide semiconductor device according to Embodiment 3. In the silicon carbide semiconductor device according to Embodiment 3 in FIG. 14, the field insulating film 51 on the second well region 31 is also formed on the third separation region 23 between the first well regions 30 around the outermost circumference and the second well region 31. Thus, there is no need to form the second insulating film different from the field insulating film 51 or the gate insulating film 50 as described in Embodiment 1. The field insulating film 51 can be formed on the third separation region 23 simultaneously when the field insulating film 51 is formed on the second well region 31, and the manufacturing processes can be simplified.

The silicon carbide semiconductor device according to Embodiment 3 can produce the advantages, for example, suppressing operations of the parasitic p-MOSFET similarly to those of the silicon carbide semiconductor device according to Embodiment 1.

Embodiment 4

In a silicon carbide semiconductor device according to Embodiment 4, a junction implantation region 43 of the first conductivity type whose impurity concentration is higher than five times that of the drift layer 20 is formed in the third separation region 23 between the first well regions 30 around the outermost circumference and the second well region 31. Since the other features are the same as those according to Embodiments 1 to 3, the detailed description will be omitted.

Figure 15:
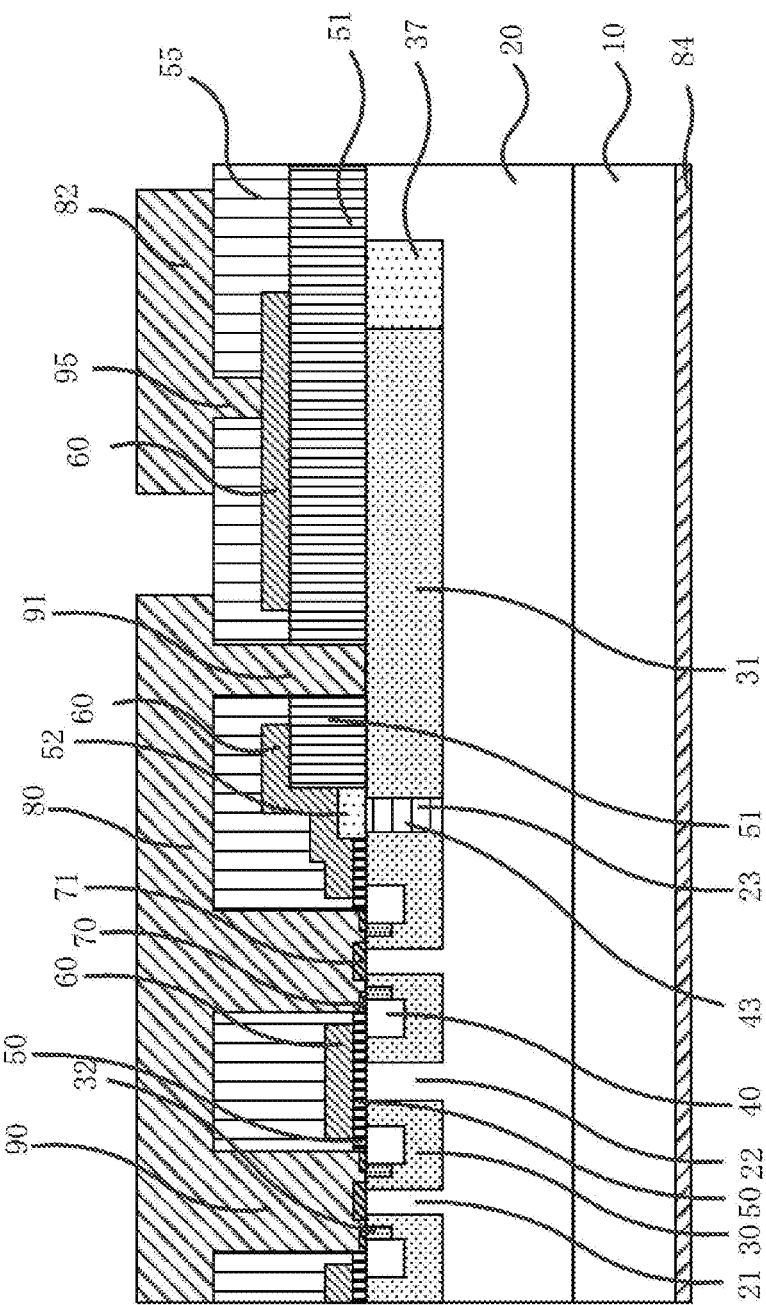
FIG. 15 is a schematic sectional view of a silicon carbide semiconductor device according to Embodiment 4 of this invention.

FIG. 15 is a schematic sectional view of the silicon carbide semiconductor device according to Embodiment 4. In the silicon carbide semiconductor device according to Embodiment 4 in FIG. 15, the junction implantation region 43 of a high impurity concentration is formed between the first well regions 30 around the outermost circumference and the second well region 31. The junction implantation region 43 should be formed by ion implantation similarly to a method for forming the source regions 40.

Since the junction implantation region 43 of a high impurity concentration is formed in the third separation region 23 in the silicon carbide semiconductor device according to Embodiment 4, a threshold voltage of a parasitic p-MOSFET formed between the first well regions 30 around the outermost circumference and the second well region 31 can be further reduced, and the parasitic p-MOSFET can be hardly turned ON. Thus, the passage of the bipolar current during the free-wheeling operations of the second well region 31 can be further suppressed.

Embodiment 5

A silicon carbide semiconductor device according to Embodiment 5 includes a high-concentration region 35 of the second conductivity type whose impurity concentration of the second conductivity type is higher than that of the second well region 31 and which is formed in a surface layer area of the second well region 31 that is adjacent to the active region. Since the other features are the same as those according to Embodiments 1 to 4, the detailed description will be omitted.

Figure 16:
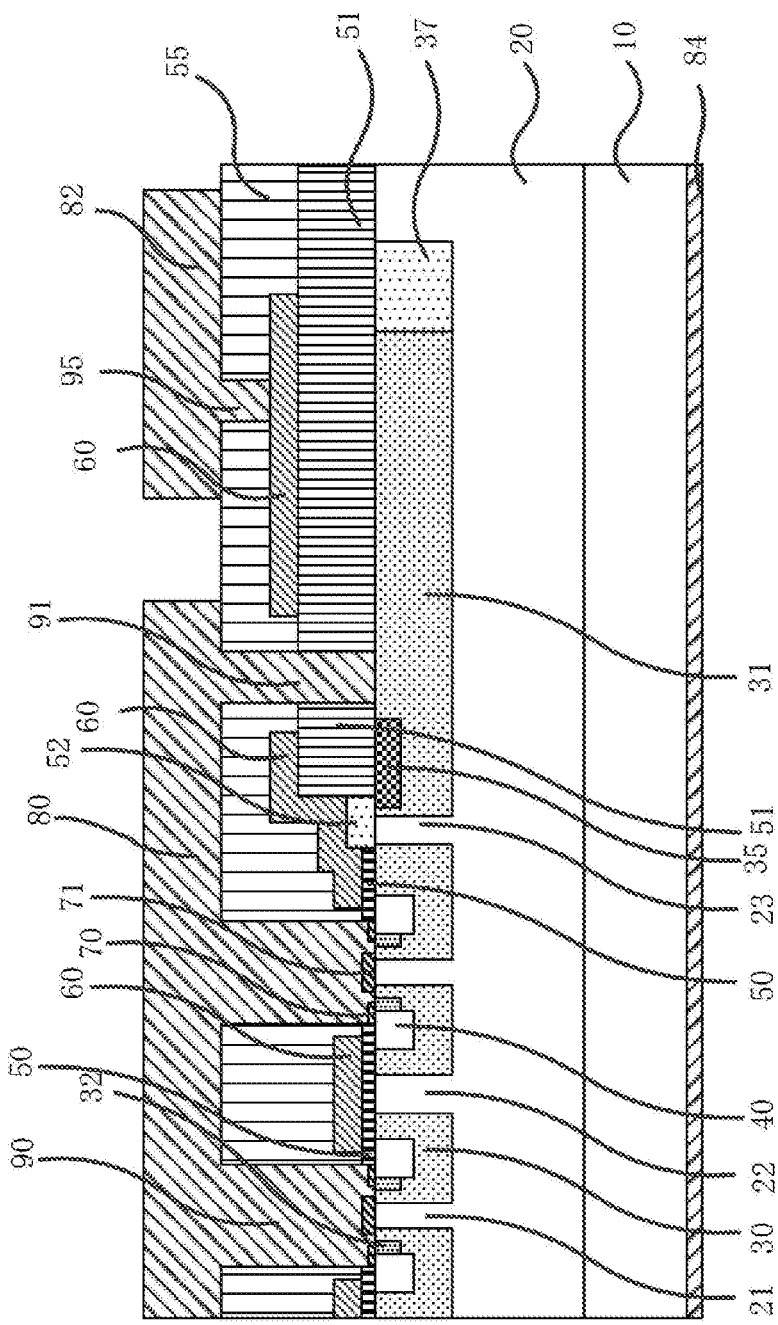
FIG. 16 is a schematic sectional view of a silicon carbide semiconductor device according to Embodiment 5 of this invention.

FIG. 16 is a schematic sectional view of the silicon carbide semiconductor device according to Embodiment 5. The high-concentration region 35 has an impurity concentration of the second conductivity type that is higher than double that of the second well region 31. The high-concentration region 35 should be formed by ion implantation in the same manner as the second well region 31.

When the second well region 31 is in a floating state without an ohmic connection to the source electrode 80 in the silicon carbide semiconductor device according to the present invention, unexpected inversion layers may be formed in an interface between the second well region 31 and the field insulating film 51, an interface between the second well region 31 and the second insulating film 52, and an interface between the first well regions 30 and the second insulating film 52.

Thus, forming the high-concentration region 35 in the surface layer area of the second well region 31 that is a region closer to the active region similarly to the silicon carbide semiconductor device according to Embodiment 5 can prevent the inversion layer from being formed in a region including at least the high-concentration region 35. Thus, it is possible to prevent the second well region 31 and the source electrode 80 from having the same potential. Consequently, the passage of the bipolar current during the free-wheeling operations of the second well region 31 can be further suppressed.

Figure 17:
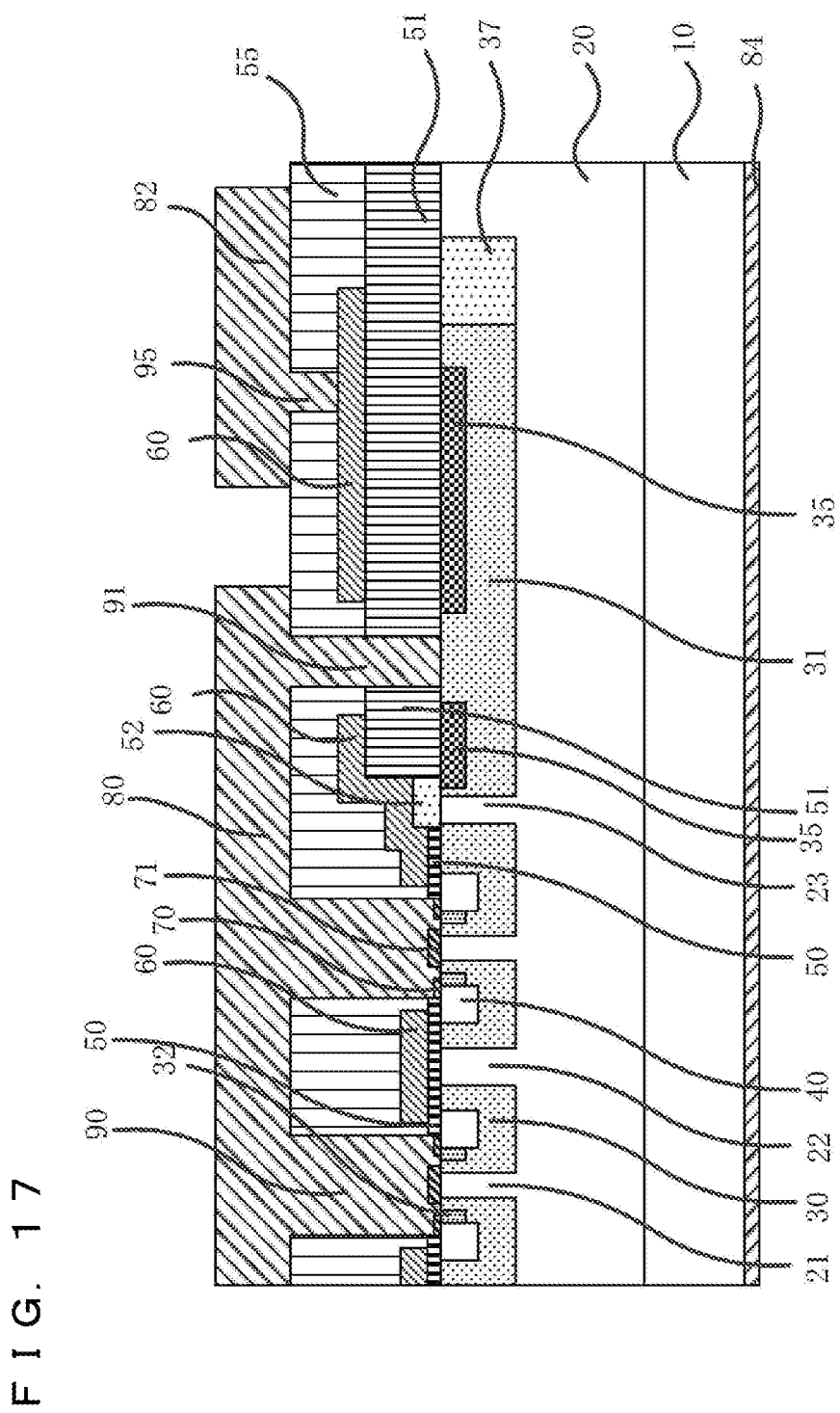
FIG. 17 is a schematic sectional view of a silicon carbide semiconductor device with another structure according to Embodiment 5 of this invention.

The resistance of the second well region 31 in the cross-lateral direction may be reduced by forming the high-concentration region 35 in a surface layer area of the other regions of the second well region 31 where the second contact hole 91 is not formed. FIG. 17 is a schematic sectional view of the high-concentration region 35 formed in the surface layer area of the other regions of the second well region 31. In such a silicon carbide semiconductor device, the resistance of the second well region 31 in the cross-lateral direction can be reduced. Moreover, the voltage generated by the displacement current flowing through the second well region 31 when the silicon carbide semiconductor device is turned ON/OFF can be reduced similarly to the silicon carbide semiconductor device according to Embodiment 2. Thus, the reliability can be enhanced more significantly.

Although the ohmic electrodes 70 and the first Schottky electrodes 71 for the source are formed separately in Embodiments above, they may be formed continuously with the same material or different materials.

Embodiments above describe, for example, a crystal structure, a plane direction of a main surface, an off angle, and each implantation condition using the specific examples. However, the applicability should not be limited to the given numerical ranges.

Embodiment 6

A silicon carbide semiconductor device according to Embodiment 6 includes a protection high-concentration region 39 whose impurity concentration of the second conductivity type is higher than that of the second well region 31 and which is formed at a position inner than a region where the JTE region 37 is formed and outer than a region where the conductive layer 47 is formed in the surface layer area in the second well region 31, in the terminal region of the silicon carbide semiconductor device according to Embodiment 2. Since the other features are the same as those according to Embodiment 2, the detailed description will be omitted.

Figure 18:
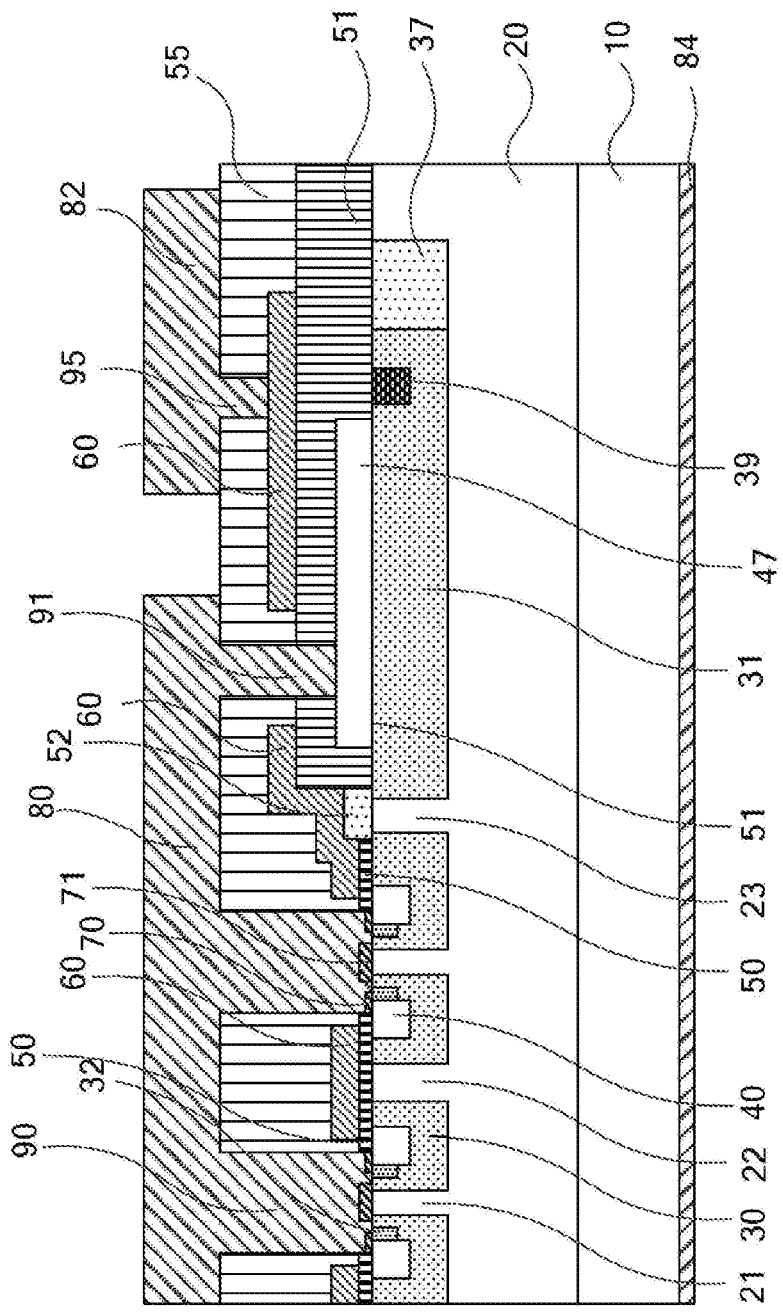
FIG. 18 is a schematic sectional view of a silicon carbide semiconductor device according to Embodiment 6 of this invention.

FIG. 18 is a schematic sectional view of the silicon carbide semiconductor device according to Embodiment 6. In the silicon carbide semiconductor device according to Embodiment 6 in FIG. 18, the protection high-concentration region 39 whose impurity concentration of the second conductivity type is higher than that of the second well region 31 is formed at the position inner than the region where the JTE region 37 is formed and outer than the region where the conductive layer 47 is formed in the surface layer area in the second well region 31. The protection high-concentration region 39 should be formed by ion implantation similarly to a method for forming the contact regions 32.

Here, the advantages of the silicon carbide semiconductor device according to Embodiment 6 will be described.

An energy level of acceptors formed by doping p-type impurities is deep in silicon carbide semiconductor devices. When elements are switched at high speed so that the acceptors have a relatively long time constant to generate carriers, particularly, generation of p-type carriers sometimes cannot catch up with the switching speed. The reason why the generation of carriers is delayed is due to delay in ionization of the acceptors (incomplete ionization).

Particularly, when the elements are turned OFF at high speed, the carrier concentration may be transiently lower than the concentration of doped acceptors due to the delay in the generation of carriers, in a region such as the JTE region 37 lower in impurity concentration than the second well region 31. In the termination structure as described in Embodiment 2, a depletion layer extends over a wider range in a region from the JTE region 37 to the second well region 31 than that in a static OFF state. The arrival of this depletion layer at a portion under the gate electrode 60 or the conductive layer 47 may break the elements.

A method for increasing the impurity concentration of the second well region 31 will be used for preventing this phenomenon. However, increase in the impurity concentration of the second well region 31 in the silicon carbide semiconductor device according to Embodiment 6 causes reverse leakage in a contact portion between the second well region 31 and the conductive layer 47, and causes the bipolar current to flow during the free-wheeling operations.

Thus, in the silicon carbide semiconductor device according to Embodiment 6, the protection high-concentration region 39 whose impurity concentration of the second conductivity type is higher than that of the second well region 31 is formed at the position inner than the region where the JTE region 37 is formed and outer than the region where the conductive layer 47 is formed in the surface layer area in the second well region 31. Thus, suppressing extension of the depletion layer into the second well region 31 in high-speed switching and preventing the reverse leakage current from flowing into a diode formed by the conductive layer 47 and the second well region 31 can significantly suppress the passage of the bipolar current from the source electrode 80 to the drain electrode 84 during the free-wheeling operations.

Although Embodiment 6 describes the presence of the conductive layer 47 on the second well region 31 similarly to the first aspect of Embodiment 2, the conductive layer 47 may be formed in the surface layer area of the second well region 31 similarly to Embodiment 2.

Figure 19:
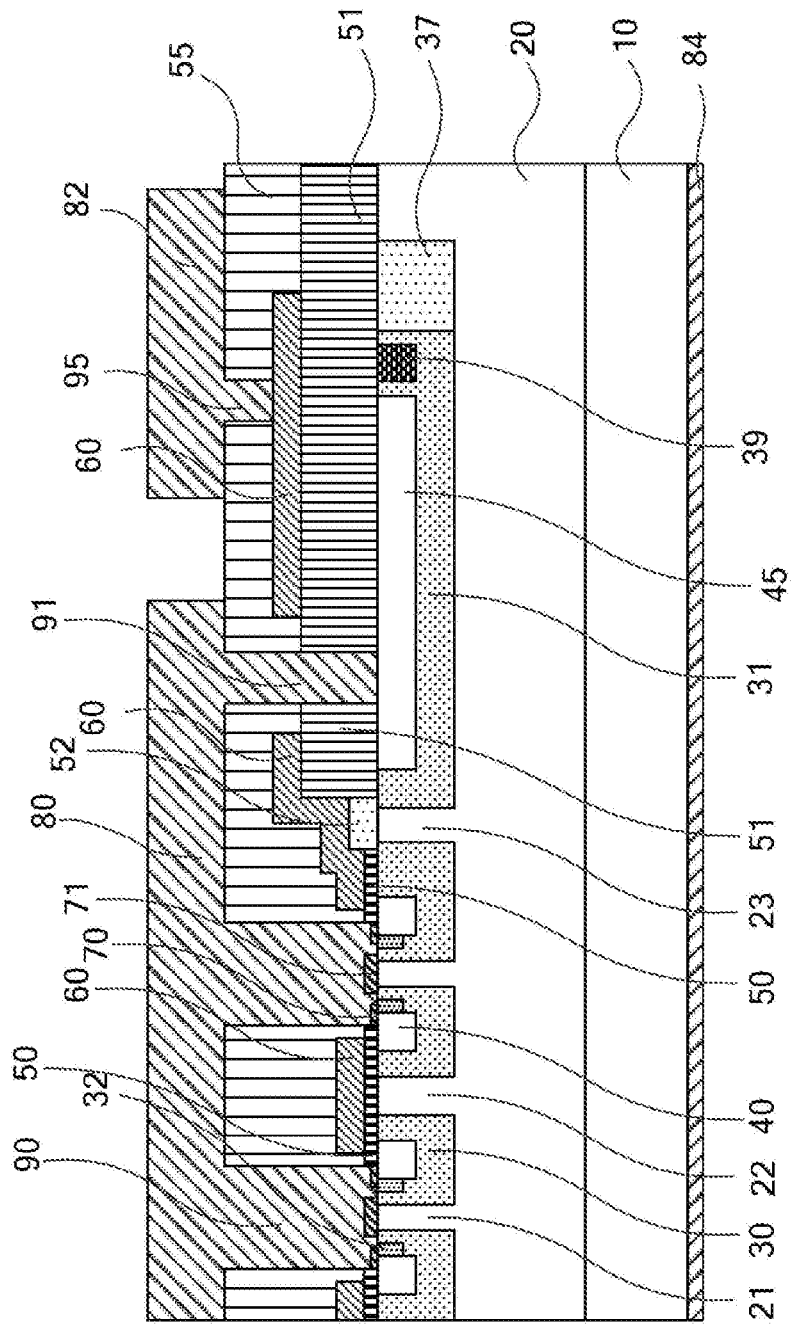
FIG. 19 is a schematic sectional view of a silicon carbide semiconductor device with another structure according to Embodiment 6 of this invention.

FIG. 19 is a sectional view when the conductive layer 47 is formed in the surface layer area of the second well region 31 and the conductive layer 47 is the silicon carbide conductive layer 45.

Embodiment 7

Embodiment 7 will describe a special structure for preventing a parasitic p-MOSFET from being turned ON, on the first well regions 30 side near the third separation region 23 between the first well regions 30 around the outermost circumference in the active region and the second well region 31 in the terminal region, in the silicon carbide semiconductor device according to each of Embodiments 1 to 6.

The structure to be described first is a structure in which a channel longer than channels in the other portions in the active region is formed between the third separation region 23 and the contact regions 32 of the first well regions 30 adjacent to the third separation region 23.

Figure 20:
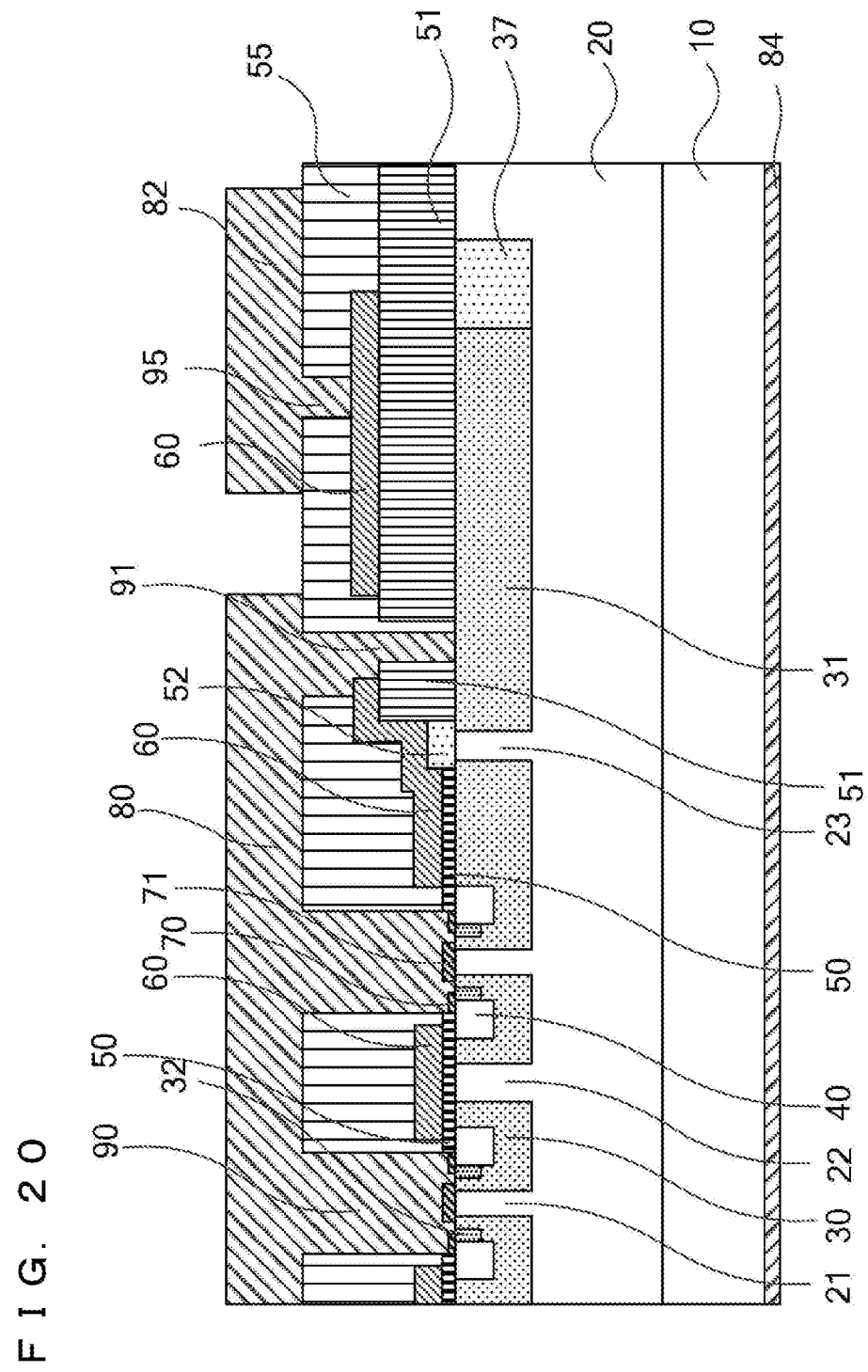
FIG. 20 is a schematic sectional view of a silicon carbide semiconductor device according to Embodiment 7 of this invention.

FIG. 20 is a schematic sectional view of the silicon carbide semiconductor device according to Embodiment 7. In the silicon carbide semiconductor device according to Embodiment 7 in FIG. 20, a region under the gate electrode 60 through the gate insulating film 50 or the second insulating film 52 between the third separation region 23 and the source regions 40 of the first well regions 30 around the outermost circumference in the active region is particularly longer than regions under the gate electrode 60 through the gate insulating film 50 between the third separation region 23 and the source regions 40 of the first well regions 30 in the other portions in the active region.

In the silicon carbide semiconductor device according to Embodiment 7, a channel length of a channel MOSFET of a parasitic n-type (the first conductivity type) which is formed in the region under the gate electrode 60 through the gate insulating film 50 or the second insulating film between the third separation region 23 and the source regions 40 of the first well regions 30 around the outermost circumference in the active region is particularly long. Thus, the parasitic n-type channel MOSFET is hardly turned ON. Moreover, the electric field to be generated by a voltage from the gate electrode 60 for turning OFF is weakened in a region where the second insulating film thicker than the gate insulating film 50 is formed which is a part of the parasitic n-type channel MOSFET. Thus, unexpected operations such as being instantly turned ON and increase in the leakage current even though the parasitic n-type channel MOSFET is turned OFF can be prevented.

Moreover, the parasitic n-type channel MOSFET may be prevented from being turned ON in another method, without particularly lengthening the region under the gate electrode 60 through the gate insulating film 50 or the second insulating film 52 between the third separation region 23 and the source regions 40 of the first well regions 30 around the outermost circumference in the active region in the silicon carbide semiconductor device according to Embodiment 7.

Figure 21:
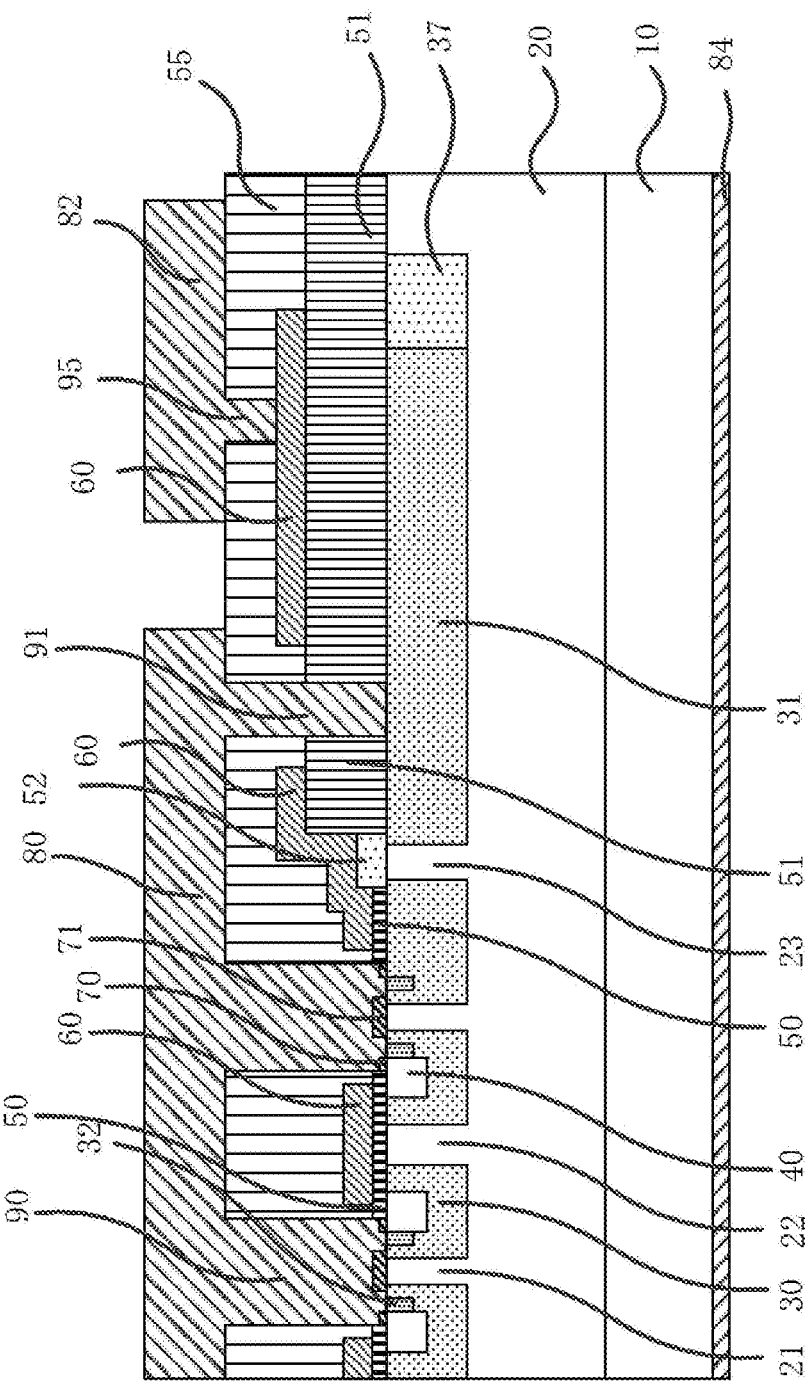
FIG. 21 is a schematic sectional view of a silicon carbide semiconductor device with another structure according to Embodiment 7 of this invention.

For example, as FIG. 21 illustrates the schematic sectional view, the source regions 40 need not be formed in the first well regions 30 around the outermost circumference in the active region. Preventing the source regions 40 from being formed in the first well regions 30 around the outermost circumference in the active region prevents the parasitic n-type channel MOSFET from being formed, and prevents the unexpected operations described above from occurring.

Figure 22:
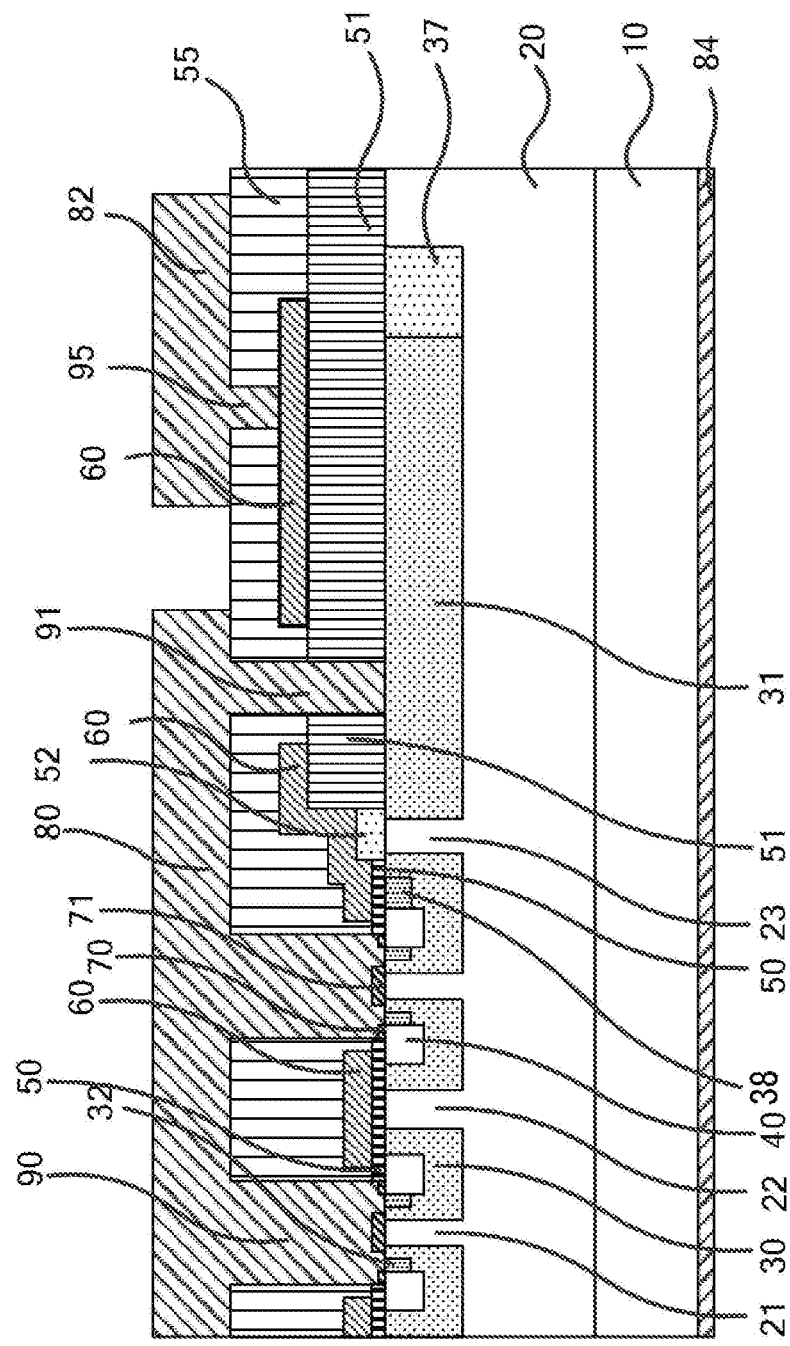
FIG. 22 is a schematic sectional view of a silicon carbide semiconductor device with another structure according to Embodiment 7 of this invention.

As FIG. 22 illustrates the schematic sectional view, a channel formation suppressing region 38 whose impurity concentration of the second conductivity type is higher than that of the first well regions 30 may be formed closer to the third separation region 23 and adjacent to each of the source regions 40 of the first well regions 30 around the outermost circumference in the active region. This structure can prevent the parasitic n-type channel MOSFET from being turned ON, and sufficiently suppress the breakdown leakage current from the edge portion of the active region.

Figure 23:
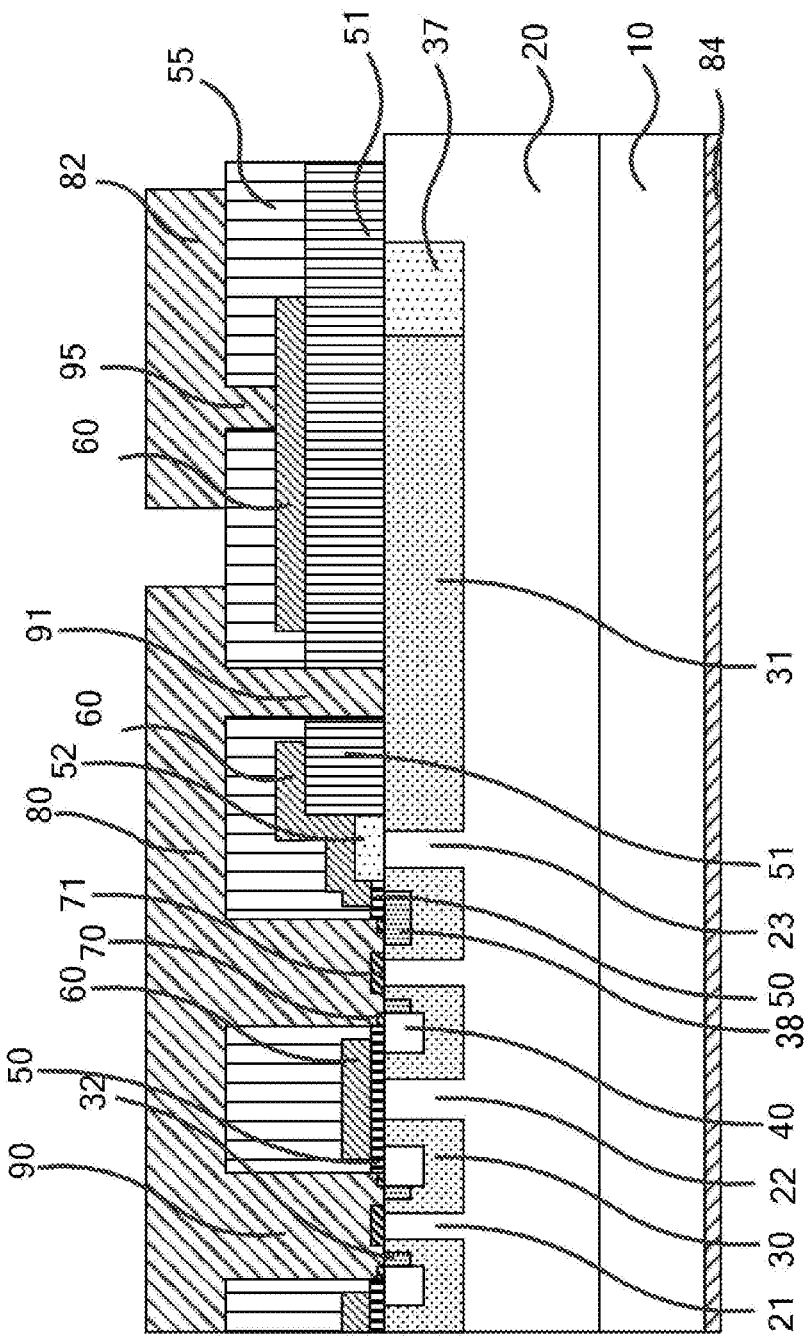
FIG. 23 is a schematic sectional view of a silicon carbide semiconductor device with another structure according to Embodiment 7 of this invention.

As FIG. 23 illustrates the schematic sectional view, integrating the contact region 32 and the channel formation suppressing region 38 formed adjacent to each of the source regions 40 closer to the third separation region 23 in FIG. 22 into one region (collectively referred to as the channel formation suppressing region 38) may prevent the source regions 40 between the contact regions 32 and the channel formation suppressing regions 38 from being formed. The structure as illustrated in FIG. 23 can reduce the width of the first well regions 30 around the outermost circumference in the active region and bring the second well region 31 in the terminal region closer to the built-in Schottky diodes around the outermost circumference in the active region. Thus, the passage of the bipolar current in the second well region 31 can be further suppressed.

Further, the gate electrode 60 above the first well regions 30 around the outermost circumference in the active region need not always be disposed on the gate insulating film 50 by adopting the structure illustrated in, for example, FIG. 22 or 23 to suppress operations of the parasitic n-type channel MOSFET.

Figure 24:
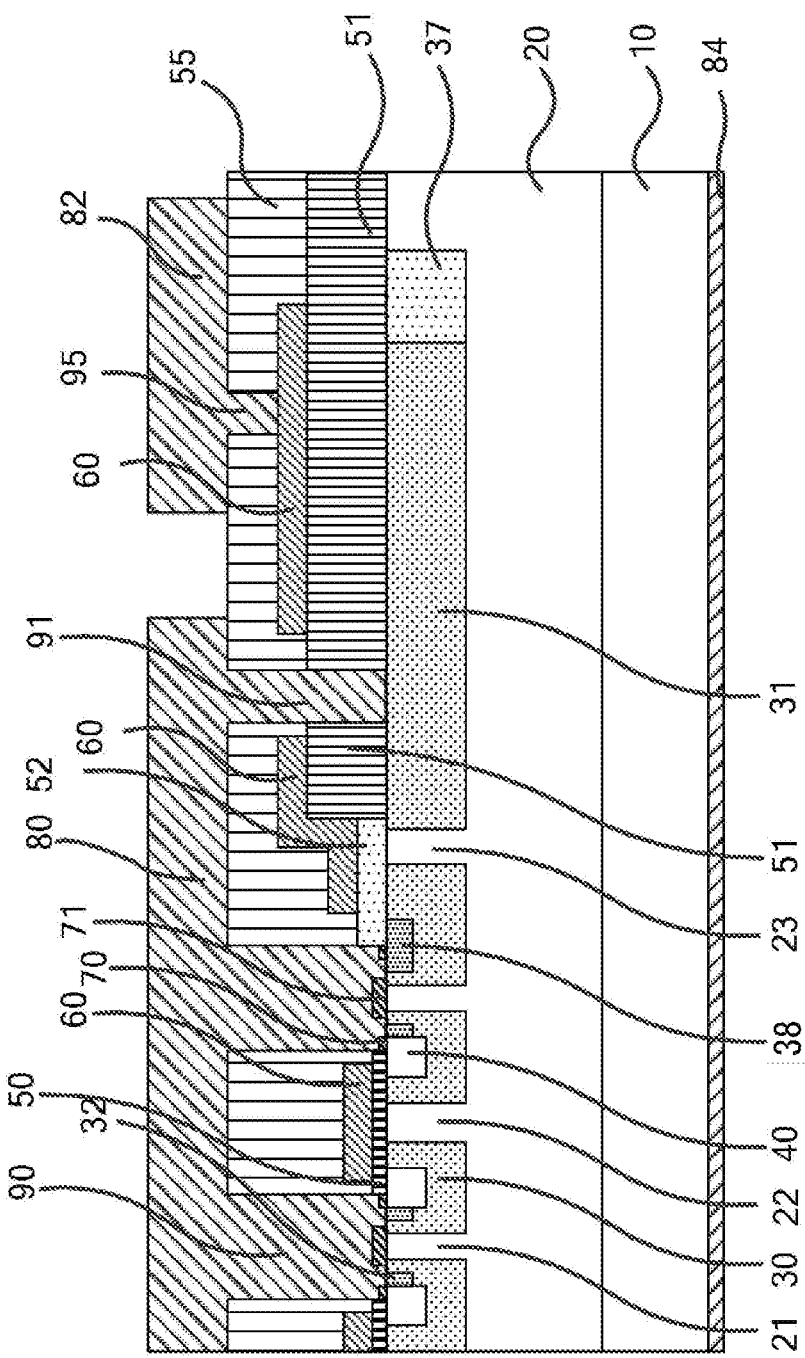
FIG. 24 is a schematic sectional view of a silicon carbide semiconductor device with another structure according to Embodiment 7 of this invention.

For example, as FIG. 24 illustrates the schematic sectional view, the gate electrode 60 above the first well regions 30 around the outermost circumference in the active region may be formed on the second insulating film 52 thicker than the gate insulating film 50 and formed also on the third separation region 23. In FIG. 24, only the channel formation suppressing regions 38 are formed in the first well regions 30 around the outermost circumference in the active region.

Figure 25:
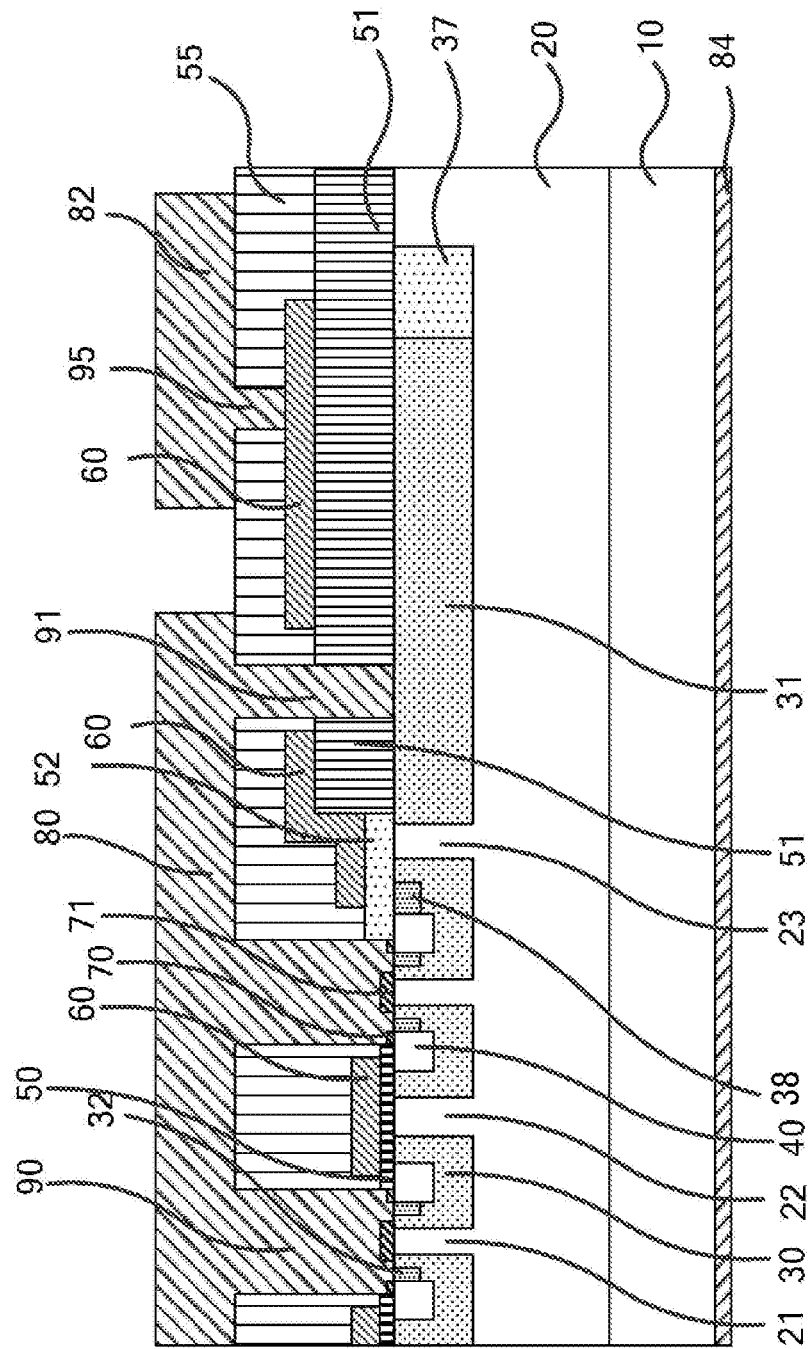
FIG. 25 is a schematic sectional view of a silicon carbide semiconductor device with another structure according to Embodiment 7 of this invention.

Similarly, the structure whose schematic sectional view is illustrated in FIG. 25 may be adopted. In FIG. 25, the contact region 32, the source region 40, and the channel formation suppressing region 38 are formed in order in each of the first well regions 30 around the outermost circumference in the active region toward the third separation region 23.

The gate electrode 60 above the first well regions 30 around the outermost circumference in the active region is formed on the second insulating film 52 thicker than the gate insulating film 50 in the structures illustrated in FIGS. 24 and 25, which hardly produce the field effect of the gate electrode 60. However, forming the channel formation suppressing region 38 can suppress the parasitic n-type MOSFET.

Although Embodiments 1 to 7 describe the first conductivity type as n-type and the second conductivity type as p-type, the present invention is not limited to this and handling the first conductivity type as p-type and the second conductivity type as n-type produces the same advantages. Although n-type (the first conductivity type) impurities are N, they may be phosphorus or arsenic. Although p-type (the second conductivity type) impurities are Al, they may be boron or gallium.

In the MOSFETs described in Embodiments 1 to 7, the gate insulating film 50 is not necessarily an oxide film made of silicon oxide, but may be an insulating film other than an oxide film or a combination of an insulating film other than an oxide film and an oxide film. Although silicon oxide resulting from thermal oxidation of silicon carbide is used for forming the gate insulating film 50, a deposited film formed by CVD using silicon oxide may be used. Further, the present invention is also applicable to a MOSFET with a super junction structure.

The devices described in Embodiments above are the MOSFETs each with the gate insulating film 50. Meanwhile, the present invention is applicable to any unipolar device, for example, a junction FET (JFET) and a metal-semiconductor field effect transistor (MESFET) without the gate insulating film 50.

Embodiment 8

Embodiment 8 will describe a power converter to which the silicon carbide semiconductor devices according to Embodiments 1 to 7 are applied. Although the present invention is not limited to specific power converters, Embodiment 8 will describe application of the present invention to a three-phase inverter.

FIG. 26 is a block diagram illustrating a configuration of a power conversion system to which the power converter according to Embodiment 8 is applied.

The power conversion system illustrated in FIG. 26 includes a power supply 100, a power converter 200, and a load 300. The power supply 100, which is a DC power supply, supplies a DC power to the power converter 200. The power source 100 may include various types of components such as a direct current system, a solar battery, or a rechargeable battery, and may include a rectifying circuit connected to an AC system or an AC/DC converter. The power source 100 may include a DC/DC converter which converts a DC power output from a DC system into a predetermined power.

The power converter 200, which is a three-phase inverter connected between the power source 100 and the load 300, converts the DC power supplied from the power source 100 into the AC power to supply the AC power to the load 300. As illustrated in FIG. 26, the power converter 200 includes a main conversion circuit 201 which converts the DC power into the AC power, a drive circuit 202 which outputs a drive signal for driving each switching element in the main conversion circuit 201, and a control circuit 203 which outputs, to the drive circuit 202, a control signal for controlling the drive circuit 202.

The load 300 is a three-phase electrical motor driven by the AC power supplied from the power converter 200. The load 300 is not limited to specific use but is an electrical motor mounted on various types of electrical devices. Thus, the load 300 is used as an electrical motor for, for example, a hybrid car, an electrical car, a rail vehicle, an elevator, or air-conditioning equipment.

The power converter 200 will be described in detail hereinafter. The main conversion circuit 201 includes switching elements and free-wheeling diodes (not shown). Switching of the switching element causes the DC power supplied from the power supply 100 to be converted into the AC power. The AC power is then supplied to the load 300. Here, a gate voltage for filming OFF the switching element may be identical to a source voltage or set lower than the source voltage. The specific circuit configuration of the main conversion circuit 201 is of various types. The main conversion circuit 201 according to Embodiment 8 is a three-phase full-bridge circuit having two levels, and includes six switching elements and six free-wheeling diodes anti-parallel connected to the respective switching elements. The silicon carbide semiconductor device according to one of Embodiments 1 to 7 is applied to each of the switching elements of the main conversion circuit 201. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 201 are connected to the load 300.

The drive circuit 202 generates drive signals for driving the switching elements of the main conversion circuit 201, and supplies the drive signals to control electrodes of the switching elements of the main conversion circuit 201. Specifically, the drive circuit 202 outputs, to the control electrodes of the switching elements in accordance with the control signal from the control circuit 203 to be described later, the drive signal for switching the switching element to an ON state and the drive signal for switching the switching element to an OFF state. The drive signal is a voltage signal (ON signal) equal to or higher than a threshold voltage of the switching element when the switching element is kept in the ON state. The drive signal is a voltage signal (OFF signal) equal to or lower than the threshold voltage of the switching element when the switching element is kept in the OFF state.

The control circuit 203 controls the switching elements of the main conversion circuit 201 so that a desired power is supplied to the load 300. Specifically, the control circuit 203 calculates a time (ON time) when each of the switching elements of the main conversion circuit 201 should enter the ON state, based on the power to be supplied to the load 300. For example, the main conversion circuit 201 can be controlled by performing PWM control for modulating the ON time of the switching elements in accordance with the voltage to be output. Then, the control circuit 203 outputs a control instruction (control signal) to the drive circuit 202 so that the drive circuit 202 outputs the ON signal to the switching element which should enter the ON state and outputs the OFF signal to the switching element which should enter the OFF state at each time. The drive circuit 202 outputs the ON signal or the OFF signal as the drive signal to the control electrode of each of the switching elements in accordance with this control signal.

Since the silicon carbide semiconductor devices according to Embodiments 1 to 7 are applied to the power converter according to Embodiment 8 as the switching elements of the main conversion circuit 201, a low-loss power converter that performs more reliable high-speed switching can be implemented.

Although Embodiment 8 describes the example of applying the present invention to the three-phase inverter having the two levels, the present invention is not limited thereto but can be applied to the various power converters. Although Embodiment 8 describes the power converter having the two levels, the power converter may have three or multiple levels. The present invention may be applied to a single-phase inverter when the power is supplied to a single-phase load. Moreover, the present invention is also applicable to a DC/DC converter or an AC/DC converter when the power is supplied to, for example, a DC load.

The power converter to which the present invention is applied is not limited to a power converter including a motor as the load. The power converter can also be used as a power-supply device of an electrical discharge machine, a laser beam machine, an induction heat cooking device, or a non-contact power feeding system, and can be further used as a power conditioner of, for example, a solar power system or an electricity storage system.

EXPLANATION OF REFERENCE SIGNS

10 semiconductor substrate, 20 drift layer, 21 first separation region, 22 second separation region, 23 third separation region, 24 fourth separation region, 30 first well region, 31 second well region, 32 contact region, 34 auxiliary connection region, 35 high-concentration region, 36 second well contact region, 37 JTE region, 38 channel formation suppressing region, 39 protection high-concentration region, 40 source region, 45 silicon carbide conductive layer, 50 gate insulating film, 51 field insulating film, 52 second insulating film, 53 insulating layer, 55 interlayer insulating film, 60 gate electrode, 70 ohmic electrode, 71 first Schottky electrode, 76 second Schottky electrode, 80 source electrode/source pad, 81 gate pad, 82 gate line, 84 drain electrode, 90 first contact hole, 91 second contact hole, 92 second-well-region contact hole, 95 gate contact hole, 100 power supply, 200 power converter, 201 main conversion circuit, 202 drive circuit, 203 control circuit, 300 load.

The invention claimed is:
1. A silicon carbide semiconductor device, comprising:
a semiconductor substrate made of silicon carbide of a first conductivity type;
a drift layer of the first conductivity type, the drift layer being formed on the semiconductor substrate;

a plurality of first well regions of a second conductivity type, the first well regions being formed in a surface layer of the drift layer;

a plurality of first separation regions of the first conductivity type, the first separation regions being formed between the first well regions;

a first Schottky electrode formed in contact with each of the first separation regions, the first Schottky electrode forming a Schottky junction with the first separation region;

an ohmic electrode formed on each of the first well regions;

a second well region of the second conductivity type, the second well region being formed in the surface layer of the drift layer separately from the first well regions;

a source region of the first conductivity type, the source region being formed in a surface layer area of each of the first well regions;

a gate insulating film formed on the first well regions;

a third separation region of the first conductivity type, the third separation region being formed between the second well region and the first well regions closest to the second well region;

a second insulating film formed in contact with the third separation region and an edge portion of the second well region that is closer to the first well regions, the second insulating film being thicker than the gate insulating film;

a gate electrode formed on the gate insulating film on the first well regions and the second insulating film in contact with the third separation region;

a gate pad connected to the gate electrode and formed above the second well region; and a source electrode electrically connected to the first Schottky electrodes and the ohmic electrodes, the source electrode having a non-ohmic connection to the second well region through a second contact hole formed on the second well region.

2. The silicon carbide semiconductor device according to claim 1,
wherein the first well regions are separated from the second well region.

3. The silicon carbide semiconductor device according to claim 1,
wherein the second insulating film is formed in contact with the entire third separation region above which the gate electrode is formed.

4. The silicon carbide semiconductor device according to claim 1,
wherein the first conductivity type is n-type, and a gate voltage in turn-off is driven by a voltage lower than a source voltage.

5. The silicon carbide semiconductor device according to claim 1,
wherein at least a part of a surface of the second well region between the third separation region and the second contact hole includes a region of the second conductivity type.

6. The silicon carbide semiconductor device according to claim 1, further comprising:
a conductive layer in a surface layer area of the second well region or on the second well region, the conductive layer having a non-ohmic connection to the second well region and being lower in resistivity than the second well region,
wherein the source electrode has an ohmic connection to the conductive layer.

7. The silicon carbide semiconductor device according to claim 6,
wherein the conductive layer is a silicon carbide conductive layer formed in the surface layer area of the second well region and made of silicon carbide of the first conductivity type.

8. The silicon carbide semiconductor device according to claim 6,
wherein a protection high-concentration region higher in impurity concentration of the second conductivity type than the second well region is formed outside and apart from the conductive layer formed in the surface layer area of the second well region.

9. The silicon carbide semiconductor device according to claim 1,
wherein the second well region forms a Schottky connection with the source electrode.

10. The silicon carbide semiconductor device according to claim 1,
wherein the second insulating film is made of a material identical to a material of a field insulating film formed on the second well region.

11. The silicon carbide semiconductor device according to claim 1,
wherein the first well regions are separated from the second well region, and the third separation region is higher in impurity concentration of the first conductivity type than the drift layer.

12. The silicon carbide semiconductor device according to claim 1, further comprising:
a high-concentration region formed in a surface layer area of the second well region which is adjacent to the first well regions, the high-concentration region being higher in impurity concentration of the second conductivity type than the second well region.

13. The silicon carbide semiconductor device according to claim 1,
wherein the first well regions are separated from the second well region, and a distance between the third separation region and the source region formed in the surface layer area of the first well region adjacent to the second well region is larger than a distance between the source region formed in the surface layer area of one of the first well regions that is not adjacent to the second well region and a second separation region between the first well regions.

14. The silicon carbide semiconductor device according to claim 1,
wherein the first well regions are separated from the second well region, and the source region is not formed in the first well region adjacent to the second well region.

15. The silicon carbide semiconductor device according to claim 1,
wherein the first well regions are separated from the second well region, and a channel formation suppressing region higher in impurity concentration of the second conductivity type than the first well regions is formed in the first well region adjacent to the second well region.

16. A power converter, comprising:
a main conversion circuit including the silicon carbide semiconductor device according to claim 1, and converting an input power to output a resulting power;
a drive circuit outputting, to the silicon carbide semiconductor device, a drive signal for driving the silicon carbide semiconductor device; and a control circuit outputting, to the drive circuit, a control signal for controlling the drive circuit.

17. A silicon carbide semiconductor device, comprising:
a semiconductor substrate made of silicon carbide of a first conductivity type;
a drift layer of the first conductivity type, the drift layer being formed on the semiconductor substrate;
first well regions of a second conductivity type, the first well regions being formed in a surface layer of the drift layer;
a source region of the first conductivity type, the source region being formed in a surface layer area of each of the first well regions;
a channel epitaxial layer of the first conductivity type which is formed on a surface of the first well regions in which the source region is not formed, the channel epitaxial layer being lower in impurity concentration of the first conductivity type than the source regions;
an ohmic electrode formed on each of the first well regions and having an ohmic connection to the first well region;
a second well region of the second conductivity type, the second well region being formed in the surface layer of the drift layer separately from the first well regions;
a gate insulating film formed on the first well regions;
a third separation region of the first conductivity type, the third separation region being formed between the second well region and the first well regions closest to the second well region;
a second insulating film formed in contact with the third separation region and an edge portion of the second well region that is closer to the first well regions, the second insulating film being thicker than the gate insulating film;
a gate electrode formed on the gate insulating film on the first well regions and the second insulating film in contact with the third separation region;
a gate pad connected to the gate electrode and formed above the second well region; and
a source electrode electrically connected to the ohmic electrodes, the source electrode having a non-ohmic connection to the second well region through a second contact hole formed on the second well region.

18. The silicon carbide semiconductor device according to claim 17,
wherein the first well regions are separated from the second well region.

19. The silicon carbide semiconductor device according to claim 17,
wherein the second insulating film is formed in contact with the entire third separation region above which the gate electrode is formed.

20. The silicon carbide semiconductor device according to claim 17,
wherein the first conductivity type is n-type, and a gate voltage in turn-off is driven by a voltage lower than a source voltage.

21. The silicon carbide semiconductor device according to claim 17,
wherein at least a part of a surface of the second well region between the third separation region and the second contact hole includes a region of the second conductivity type.

22. The silicon carbide semiconductor device according to claim 17, comprising
a conductive layer in a surface layer area of the second well region or on the second well region, the conductive layer having a non-ohmic connection to the second well region and being lower in resistivity than the second well region,
wherein the source electrode has an ohmic connection to the conductive layer.

23. The silicon carbide semiconductor device according to claim 22,
wherein the conductive layer is a silicon carbide conductive layer formed in the surface layer area of the second well region and made of silicon carbide of the first conductivity type.

24. The silicon carbide semiconductor device according to claim 22,
wherein a protection high-concentration region higher in impurity concentration of the second conductivity type than the second well region is formed outside and apart from the conductive layer formed in the surface layer area of the second well region.

25. The silicon carbide semiconductor device according to claim 17,
wherein the second well region forms a Schottky connection with the source electrode.

26. The silicon carbide semiconductor device according to claim 17,
wherein the second insulating film is made of a material identical to a material of a field insulating film formed on the second well region.

27. The silicon carbide semiconductor device according to claim 17,
wherein the first well regions are separated from the second well region, and the third separation region is higher in impurity concentration of the first conductivity type than the drift layer.

28. The silicon carbide semiconductor device according to claim 17, further comprising:
a high-concentration region formed in a surface layer area of the second well region which is adjacent to the first well regions, the high-concentration region being higher in impurity concentration of the second conductivity type than the second well region.

29. The silicon carbide semiconductor device according to claim 17,
wherein the first well regions are separated from the second well region, and a distance between the third separation region and the source region formed in the surface layer area of the first well region adjacent to the second well region is larger than a distance between the source region formed in the surface layer area of one of the first well regions that is not adjacent to the second well region and a second separation region between the first well regions.

30. The silicon carbide semiconductor device according to claim 17,
wherein the first well regions are separated from the second well region, and the source region is not formed in the first well region adjacent to the second well region.

31. The silicon carbide semiconductor device according to claim 17,
wherein the first well regions are separated from the second well region, and a channel formation suppressing region higher in impurity concentration of the second conductivity type than the first well regions is formed in the first well region adjacent to the second well region.

32. A power converter, comprising:
- a main conversion circuit including the silicon carbide semiconductor device according to claim 17, and converting an input power to output a resulting power;
- a drive circuit outputting, to the silicon carbide semiconductor device, a drive signal for driving the silicon carbide semiconductor device; and
- a control circuit outputting, to the drive circuit, a control signal for controlling the drive circuit.

\* \* \* \* \*